US009305862B2

United States Patent
McElrea et al.

(10) Patent No.: US 9,305,862 B2
(45) Date of Patent: *Apr. 5, 2016

(54) SUPPORT MOUNTED ELECTRICALLY INTERCONNECTED DIE ASSEMBLY

(75) Inventors: Simon J. S. McElrea, Scotts Valley, CA (US); Marc E. Robinson, San Jose, CA (US); Lawrence Douglas Andrews, Jr., Los Gatos, CA (US)

(73) Assignee: Invensas Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/456,126

(22) Filed: Apr. 25, 2012

(65) Prior Publication Data

US 2013/0099392 A1    Apr. 25, 2013

Related U.S. Application Data

(63) Continuation of application No. 12/403,175, filed on Mar. 12, 2009, now Pat. No. 8,178,978.

(60) Provisional application No. 61/035,989, filed on Mar. 12, 2008.

(51) Int. Cl.
*H01L 23/495* (2006.01)
*H01L 23/50* (2006.01)
(Continued)

(52) U.S. Cl.
CPC ............... *H01L 23/48* (2013.01); *H01L 21/58* (2013.01); *H01L 24/24* (2013.01); *H01L 24/80* (2013.01);
(Continued)

(58) Field of Classification Search
CPC ............ H01L 2924/00014; H01L 2924/14; H01L 23/48; H01L 2224/14135; H01L 2224/14143; H01L 2224/14163; H01L 2224/14165; H01L 2224/32237; H01L 24/24; H01L 25/0657; H01L 21/58; H01L 2224/24145; H01L 2225/06551; H01L 2225/06562; H01L 2924/01015; H01L 2924/01038; H01L 2924/097701; H01L 2924/01047; H01L 2924/014; H01L 2224/32225
USPC ............ 257/777, 773, E21.599, E23.01, 735, 257/E23.014, E23.001, 686, E25.013, 257/E23.146, 676, 712, 713, E21.499, 257/E23.031, E23.08, E25.029, 737, 738, 257/778, 691, 696, 698
See application file for complete search history.

(56) References Cited

U.S. PATENT DOCUMENTS 4,323,914 A    4/1982 Berndlmaier et al.
4,336,551 A    6/1982 Fujita et al.
(Continued)

FOREIGN PATENT DOCUMENTS

CN    2512114 Y    9/2002
CN    1531069 A    9/2004
(Continued)

OTHER PUBLICATIONS

Amendment filed Jan. 24, 2007 in response to Jan. 8, 2007 Office Action, U.S. Appl. No. 11/097,829.
(Continued)

*Primary Examiner* — Alexander Oscar Williams
(74) *Attorney, Agent, or Firm* — Lerner, David, Littenberg, Krumholz & Mentlik, LLP

(57) ABSTRACT

Stacked die assemblies are electrically connected to connection sites on any support, without electrical connection to any interposed substrate or leadframe, and without solder.

17 Claims, 8 Drawing Sheets

(51) Int. Cl.
   *H01L 23/34*     (2006.01)
   *H01L 25/16*     (2006.01)
   *H01L 21/50*     (2006.01)
   *H01L 23/48*     (2006.01)
   *H01L 23/00*     (2006.01)
   *H01L 25/065*    (2006.01)
   *H01L 29/06*     (2006.01)
   *H01L 21/58*     (2006.01)

(52) U.S. Cl.
   CPC ............ *H01L 24/82* (2013.01); *H01L 25/0657* (2013.01); *H01L 29/0657* (2013.01); *H01L 2224/24145* (2013.01); *H01L 2224/32145* (2013.01); *H01L 2224/32225* (2013.01); *H01L 2224/76155* (2013.01); *H01L 2224/82102* (2013.01); *H01L 2225/06524* (2013.01); *H01L 2225/06551* (2013.01); *H01L 2225/06555* (2013.01); *H01L 2225/06562* (2013.01); *H01L 2924/014* (2013.01); *H01L 2924/01005* (2013.01); *H01L 2924/01006* (2013.01); *H01L 2924/01013* (2013.01); *H01L 2924/01015* (2013.01); *H01L 2924/01033* (2013.01); *H01L 2924/01038* (2013.01); *H01L 2924/01047* (2013.01); *H01L 2924/01067* (2013.01); *H01L 2924/01082* (2013.01); *H01L 2924/09701* (2013.01); *H01L 2924/14* (2013.01); *H01L 2924/15311* (2013.01); *H01L 2924/15787* (2013.01)

(56) References Cited

U.S. PATENT DOCUMENTS

| | | | |
|---|---|---|---|
| 4,363,076 A | 12/1982 | McIver | |
| 4,500,905 A | 2/1985 | Shibata | |
| 4,784,972 A | 11/1988 | Hatada | |
| 5,107,325 A | 4/1992 | Nakayoshi | |
| 5,138,438 A | 8/1992 | Masayuki et al. | |
| 5,200,362 A | 4/1993 | Lin et al. | |
| 5,218,234 A | 6/1993 | Thompson et al. | |
| 5,311,401 A | 5/1994 | Gates, Jr. et al. | |
| 5,331,591 A | 7/1994 | Clifton | |
| 5,334,872 A | 8/1994 | Ueda et al. | |
| 5,434,745 A | 7/1995 | Shokrgozar et al. | |
| 5,466,634 A | 11/1995 | Beilstein, Jr. et al. | |
| 5,538,758 A | 7/1996 | Beach et al. | |
| 5,571,754 A | 11/1996 | Bertin et al. | |
| 5,616,953 A | 4/1997 | King et al. | |
| 5,629,566 A | 5/1997 | Doi et al. | |
| 5,675,180 A | 10/1997 | Pedersen et al. | |
| 5,691,248 A | 11/1997 | Cronin et al. | |
| 5,698,895 A | 12/1997 | Pedersen et al. | |
| 5,716,759 A | 2/1998 | Badehi | |
| 5,721,151 A | 2/1998 | Padmanabhan et al. | |
| 5,731,631 A | 3/1998 | Yama et al. | |
| 5,737,191 A | 4/1998 | Horiuchi et al. | |
| 5,870,351 A | 2/1999 | Ladabaum et al. | |
| 5,879,965 A | 3/1999 | Jiang et al. | |
| 5,891,761 A | 4/1999 | Vindasius et al. | |
| 5,910,687 A | 6/1999 | Chen et al. | |
| 5,946,545 A | 8/1999 | Bertin et al. | |
| 5,965,947 A | 10/1999 | Nam et al. | |
| 6,030,854 A | 2/2000 | Mashimoto et al. | |
| 6,034,438 A | 3/2000 | Petersen | |
| 6,087,716 A | 7/2000 | Ikeda | |
| 6,107,164 A | 8/2000 | Ohuchi | |
| 6,175,158 B1 | 1/2001 | Degani et al. | |
| 6,225,689 B1 * | 5/2001 | Moden et al. ............. | 257/686 |
| 6,228,686 B1 | 5/2001 | Smith et al. | |
| 6,255,726 B1 | 7/2001 | Vindasius et al. | |
| 6,262,476 B1 | 7/2001 | Vidal | |
| 6,271,598 B1 | 8/2001 | Vindasius et al. | |
| 6,297,657 B1 | 10/2001 | Thiessen et al. | |
| 6,303,977 B1 | 10/2001 | Schroen et al. | |
| 6,315,856 B1 | 11/2001 | Asagiri et al. | |
| 6,326,244 B1 | 12/2001 | Brooks et al. | |
| 6,326,689 B1 | 12/2001 | Thomas | |
| 6,338,980 B1 | 1/2002 | Satoh | |
| 6,351,030 B2 | 2/2002 | Havens et al. | |
| 6,472,746 B2 | 10/2002 | Taniguchi et al. | |
| 6,476,467 B2 | 11/2002 | Nakamura et al. | |
| 6,569,709 B2 | 5/2003 | Derderian | |
| D475,981 S | 6/2003 | Michii | |
| 6,580,165 B1 | 6/2003 | Singh | |
| 6,582,992 B2 | 6/2003 | Poo et al. | |
| 6,593,648 B2 | 7/2003 | Emoto | |
| 6,607,938 B2 | 8/2003 | Kwon et al. | |
| 6,607,941 B2 | 8/2003 | Prabhu et al. | |
| 6,621,155 B1 | 9/2003 | Perino et al. | |
| 6,621,172 B2 | 9/2003 | Nakayama et al. | |
| 6,624,505 B2 | 9/2003 | Badehi | |
| 6,656,827 B1 | 12/2003 | Tsao et al. | |
| 6,667,543 B1 | 12/2003 | Chow et al. | |
| 6,670,701 B2 | 12/2003 | Matsuura et al. | |
| 6,674,159 B1 | 1/2004 | Peterson et al. | |
| 6,686,655 B2 | 2/2004 | Moden et al. | |
| 6,706,971 B2 | 3/2004 | Albert et al. | |
| 6,722,213 B2 | 4/2004 | Offen et al. | |
| 6,730,997 B2 | 5/2004 | Beyne et al. | |
| 6,737,743 B2 | 5/2004 | Urakawa | |
| 6,747,348 B2 | 6/2004 | Jeung et al. | |
| 6,750,547 B2 | 6/2004 | Jeung et al. | |
| 6,756,252 B2 | 6/2004 | Nakanishi | |
| 6,777,767 B2 | 8/2004 | Badehi | |
| 6,802,446 B2 | 10/2004 | Chaudhuri et al. | |
| 6,844,623 B1 | 1/2005 | Peterson et al. | |
| 6,849,802 B2 | 2/2005 | Song et al. | |
| 6,908,784 B1 | 6/2005 | Farnworth et al. | |
| 6,910,268 B2 | 6/2005 | Miller | |
| 6,940,022 B1 | 9/2005 | Vinciarelli et al. | |
| 6,956,283 B1 | 10/2005 | Peterson | |
| 6,964,915 B2 | 11/2005 | Farnworth et al. | |
| 6,972,480 B2 | 12/2005 | Zilber et al. | |
| 6,973,718 B2 | 12/2005 | Sheppard, Jr. et al. | |
| 6,984,885 B1 | 1/2006 | Harada et al. | |
| 7,005,324 B2 | 2/2006 | Imai | |
| 7,029,949 B2 | 4/2006 | Farnworth et al. | |
| 7,061,125 B2 | 6/2006 | Cho et al. | |
| 7,115,986 B2 | 10/2006 | Moon et al. | |
| 7,180,168 B2 | 2/2007 | Imai | |
| 7,190,060 B1 | 3/2007 | Chiang | |
| 7,196,262 B2 | 3/2007 | Gronet | |
| 7,208,335 B2 | 4/2007 | Boon et al. | |
| 7,208,345 B2 | 4/2007 | Meyer et al. | |
| 7,215,018 B2 | 5/2007 | Vindasius et al. | |
| 7,221,051 B2 | 5/2007 | Ono et al. | |
| 7,245,021 B2 | 7/2007 | Vindasius et al. | |
| 7,259,455 B2 | 8/2007 | Seto | |
| 7,279,363 B2 | 10/2007 | Cherukuri et al. | |
| 7,285,865 B2 | 10/2007 | Kwon et al. | |
| 7,335,533 B2 | 2/2008 | Derderian | |
| 7,355,274 B2 | 4/2008 | Lim | |
| 7,405,138 B2 | 7/2008 | Ohuchi et al. | |
| 7,408,243 B2 | 8/2008 | Shiffer | |
| 7,452,743 B2 | 11/2008 | Oliver et al. | |
| 7,514,350 B2 | 4/2009 | Hashimoto | |
| 7,521,288 B2 | 4/2009 | Arai et al. | |
| 7,535,109 B2 | 5/2009 | Robinson et al. | |
| 7,564,142 B2 | 7/2009 | Hashimoto | |
| 7,595,222 B2 | 9/2009 | Shimoishizaka et al. | |
| 7,601,039 B2 | 10/2009 | Eldridge et al. | |
| 7,638,869 B2 | 12/2009 | Irsigler et al. | |
| 7,662,670 B2 | 2/2010 | Noma et al. | |
| 7,662,671 B2 | 2/2010 | Saeki | |
| 7,704,794 B2 | 4/2010 | Mess et al. | |
| 7,732,912 B2 | 6/2010 | Damberg | |
| 7,768,795 B2 | 8/2010 | Sakurai et al. | |
| 7,829,438 B2 | 11/2010 | Haba et al. | |
| 7,863,159 B2 | 1/2011 | Co et al. | |
| 7,888,185 B2 * | 2/2011 | Corisis et al. ............. | 438/123 |
| 7,901,989 B2 | 3/2011 | Haba et al. | |
| 7,919,846 B2 * | 4/2011 | Hembree ............. | 257/686 |

(56) References Cited

U.S. PATENT DOCUMENTS

| | | | |
|---|---|---|---|
| 7,923,349 B2 | 4/2011 | McElrea et al. | |
| 7,952,195 B2 | 5/2011 | Haba | |
| 8,022,527 B2 | 9/2011 | Haba et al. | |
| 8,076,788 B2 | 12/2011 | Haba et al. | |
| 8,178,978 B2* | 5/2012 | McElrea et al. | 257/777 |
| 2001/0012725 A1 | 8/2001 | Maeda et al. | |
| 2001/0031548 A1 | 10/2001 | Elenius et al. | |
| 2002/0006686 A1 | 1/2002 | Cloud et al. | |
| 2002/0027257 A1 | 3/2002 | Kinsman et al. | |
| 2002/0045290 A1* | 4/2002 | Ball | 438/106 |
| 2002/0096349 A1 | 7/2002 | Hedler et al. | |
| 2002/0127775 A1 | 9/2002 | Haba et al. | |
| 2002/0168798 A1 | 11/2002 | Glenn et al. | |
| 2002/0180010 A1 | 12/2002 | Tsubosaki et al. | |
| 2002/0185725 A1 | 12/2002 | Moden et al. | |
| 2002/0187260 A1 | 12/2002 | Sheppard, Jr. et al. | |
| 2002/0190368 A1 | 12/2002 | Shimoe et al. | |
| 2003/0038353 A1 | 2/2003 | Derderian | |
| 2003/0038356 A1 | 2/2003 | Derderian | |
| 2003/0038357 A1 | 2/2003 | Derderian | |
| 2003/0060034 A1 | 3/2003 | Beyne et al. | |
| 2003/0071338 A1 | 4/2003 | Jeung et al. | |
| 2003/0071341 A1 | 4/2003 | Jeung et al. | |
| 2003/0080403 A1 | 5/2003 | Jeung et al. | |
| 2003/0092326 A1 | 5/2003 | Nishikawa et al. | |
| 2003/0096454 A1 | 5/2003 | Poo et al. | |
| 2003/0099085 A1 | 5/2003 | Duva | |
| 2003/0122243 A1 | 7/2003 | Lee et al. | |
| 2003/0143819 A1 | 7/2003 | Hedler et al. | |
| 2003/0162369 A1 | 8/2003 | Kobayashi | |
| 2003/0209772 A1 | 11/2003 | Prabhu | |
| 2004/0113283 A1 | 6/2004 | Farnworth et al. | |
| 2004/0142509 A1 | 7/2004 | Imai | |
| 2004/0150095 A1 | 8/2004 | Fraley et al. | |
| 2004/0173892 A1 | 9/2004 | Nakanishi | |
| 2004/0195667 A1 | 10/2004 | Karnezos | |
| 2004/0198033 A1 | 10/2004 | Lee et al. | |
| 2004/0212083 A1* | 10/2004 | Yang | 257/723 |
| 2004/0217446 A1 | 11/2004 | Headley et al. | |
| 2004/0227235 A1 | 11/2004 | Hashimoto | |
| 2004/0238933 A1 | 12/2004 | Chen et al. | |
| 2004/0251520 A1 | 12/2004 | Sasaki et al. | |
| 2004/0262035 A1 | 12/2004 | Ko et al. | |
| 2005/0013927 A1 | 1/2005 | Yamazaki | |
| 2005/0067680 A1 | 3/2005 | Boon et al. | |
| 2005/0067694 A1 | 3/2005 | Pon et al. | |
| 2005/0082651 A1 | 4/2005 | Farnworth et al. | |
| 2005/0085050 A1 | 4/2005 | Draney et al. | |
| 2005/0101039 A1 | 5/2005 | Chen et al. | |
| 2005/0104179 A1 | 5/2005 | Zilber et al. | |
| 2005/0148160 A1 | 7/2005 | Farnworth et al. | |
| 2005/0156323 A1 | 7/2005 | Tokunaga | |
| 2005/0230802 A1 | 10/2005 | Vindasius et al. | |
| 2005/0248021 A1 | 11/2005 | Morkner | |
| 2005/0258530 A1 | 11/2005 | Vindasius et al. | |
| 2005/0287705 A1 | 12/2005 | Yang | |
| 2005/0287709 A1 | 12/2005 | Lee et al. | |
| 2006/0003552 A1 | 1/2006 | Okada | |
| 2006/0035408 A1 | 2/2006 | Derderian | |
| 2006/0046436 A1 | 3/2006 | Ohuchi et al. | |
| 2006/0055050 A1 | 3/2006 | Numata et al. | |
| 2006/0068567 A1 | 3/2006 | Beyne et al. | |
| 2006/0076690 A1 | 4/2006 | Khandros et al. | |
| 2006/0094165 A1 | 5/2006 | Hedler et al. | |
| 2006/0097356 A1 | 5/2006 | Fujii et al. | |
| 2006/0103000 A1 | 5/2006 | Kurosawa | |
| 2006/0121645 A1 | 6/2006 | Ball | |
| 2006/0138626 A1 | 6/2006 | Liew et al. | |
| 2006/0220262 A1 | 10/2006 | Meyer et al. | |
| 2006/0267173 A1 | 11/2006 | Takiar et al. | |
| 2006/0273365 A1 | 12/2006 | Cross et al. | |
| 2006/0278971 A1 | 12/2006 | Barnes et al. | |
| 2007/0023900 A1 | 2/2007 | Toyoda | |
| 2007/0029684 A1 | 2/2007 | Arai et al. | |
| 2007/0065987 A1 | 3/2007 | Mess et al. | |
| 2007/0102801 A1 | 5/2007 | Ishida et al. | |
| 2007/0132082 A1 | 6/2007 | Tang et al. | |
| 2007/0158799 A1 | 7/2007 | Chiu et al. | |
| 2007/0158807 A1 | 7/2007 | Lu et al. | |
| 2007/0170572 A1 | 7/2007 | Liu et al. | |
| 2007/0181989 A1 | 8/2007 | Corisis et al. | |
| 2007/0187811 A1 | 8/2007 | Arai et al. | |
| 2007/0194462 A1 | 8/2007 | Kim et al. | |
| 2007/0222054 A1* | 9/2007 | Hembree | 257/686 |
| 2007/0252262 A1 | 11/2007 | Robinson et al. | |
| 2007/0284716 A1 | 12/2007 | Vindasius et al. | |
| 2008/0083976 A1 | 4/2008 | Haba et al. | |
| 2008/0083977 A1 | 4/2008 | Haba et al. | |
| 2008/0112150 A1 | 5/2008 | Jones | |
| 2008/0150158 A1 | 6/2008 | Chin | |
| 2008/0166836 A1 | 7/2008 | Jobetto | |
| 2008/0173792 A1 | 7/2008 | Yang et al. | |
| 2008/0180242 A1 | 7/2008 | Cottingham | |
| 2008/0203566 A1 | 8/2008 | Su | |
| 2008/0206915 A1 | 8/2008 | Yamazaki | |
| 2008/0208043 A1 | 8/2008 | Smith et al. | |
| 2008/0251913 A1 | 10/2008 | Inomata | |
| 2008/0251939 A1 | 10/2008 | Chung et al. | |
| 2008/0284044 A1 | 11/2008 | Myers | |
| 2008/0290493 A1 | 11/2008 | Tsunozaki | |
| 2008/0303131 A1* | 12/2008 | McElrea et al. | 257/686 |
| 2008/0308921 A1 | 12/2008 | Kim | |
| 2008/0315407 A1 | 12/2008 | Andrews, Jr. et al. | |
| 2009/0020887 A1 | 1/2009 | Mizuno et al. | |
| 2009/0020889 A1 | 1/2009 | Murayama et al. | |
| 2009/0065948 A1 | 3/2009 | Wang | |
| 2009/0068790 A1* | 3/2009 | Caskey et al. | 438/109 |
| 2009/0102038 A1 | 4/2009 | McEelrea et al. | |
| 2009/0160065 A1 | 6/2009 | Haba et al. | |
| 2009/0230528 A1* | 9/2009 | McElrea et al. | 257/676 |
| 2009/0316378 A1 | 12/2009 | Haba et al. | |
| 2010/0140753 A1* | 6/2010 | Hembree | 257/621 |
| 2010/0140811 A1* | 6/2010 | Leal et al. | 257/777 |
| 2010/0148352 A1* | 6/2010 | Moden | 257/692 |
| 2010/0207277 A1 | 8/2010 | Bauer et al. | |
| 2010/0327461 A1* | 12/2010 | Co et al. | 257/777 |
| 2011/0006432 A1 | 1/2011 | Haba et al. | |
| 2011/0031629 A1 | 2/2011 | Haba et al. | |
| 2011/0033979 A1 | 2/2011 | Haba et al. | |
| 2011/0049696 A1 | 3/2011 | Haba et al. | |
| 2011/0187007 A1 | 8/2011 | Haba et al. | |
| 2011/0248410 A1 | 10/2011 | Avsian et al. | |
| 2011/0266684 A1* | 11/2011 | Leal | 257/773 |
| 2012/0080807 A1 | 4/2012 | Haba et al. | |
| 2012/0133057 A1 | 5/2012 | Haba et al. | |
| 2012/0211878 A1* | 8/2012 | Popovic et al. | 257/690 |
| 2013/0099392 A1 | 4/2013 | McElrea et al. | |
| 2013/0119542 A1* | 5/2013 | Oh | 257/738 |
| 2013/0154117 A1* | 6/2013 | Tan et al. | 257/777 |

FOREIGN PATENT DOCUMENTS

| | | |
|---|---|---|
| CN | 1638118 A | 7/2005 |
| CN | 1905148 A | 1/2007 |
| DE | 102004039906 A1 | 8/2005 |
| EP | 1041624 A1 | 10/2000 |
| EP | 1763894 A2 | 3/2007 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |
| JP | 2007073803 A | 3/2007 |
| JP | 2007523482 A | 8/2007 |
| JP | 2008160119 A | 7/2008 |

(56) References Cited

FOREIGN PATENT DOCUMENTS

| | | | |
|---|---|---|---|
| JP | 2008205453 A | 9/2008 | |
| JP | 2008236688 A | 10/2008 | |
| JP | 2009-026969 | 2/2009 | |
| JP | 2009027039 A | 2/2009 | |
| KR | 20-1994-0004952 | 7/1994 | |
| KR | 10-1999-0008537 | 2/1999 | |
| KR | 20010062722 A | 7/2001 | |
| KR | 20050009036 A | 1/2005 | |
| KR | 20070018057 A | 2/2007 | |
| KR | 100813624 B1 | 3/2008 | |
| KR | 20080045259 A | 5/2008 | |
| KR | 20080069549 A | 7/2008 | |
| KR | 20080091980 | 10/2008 | |
| TW | 475244 | 2/2002 | |
| TW | 200425356 A | 11/2004 | |
| TW | 200504995 A | 2/2005 | |
| TW | 200527549 A | 8/2005 | |
| TW | 200605298 A | 2/2006 | |
| TW | 200721471 | 6/2007 | |
| TW | 200940570 A | 10/2009 | |
| WO | 9425987 A1 | 11/1994 | |
| WO | 9907015 A1 | 2/1999 | |
| WO | 9909599 A2 | 2/1999 | |
| WO | 0164344 A2 | 9/2001 | |
| WO | 2005081315 A2 | 9/2005 | |
| WO | 2005101492 A2 | 10/2005 | |
| WO | 2009032371 A1 | 3/2009 | |
| WO | 2009052150 A1 | 4/2009 | |
| WO | 2009114670 A2 | 9/2009 | |

OTHER PUBLICATIONS

Amendment filed Jun. 26, 2010 in response to May 24, 2010 Office Action, U.S. Appl. No. 12/124,097.
Final Office Action mailed Jan. 8, 2007, U.S. Appl. No. 11/097,829.
Ko, et al. Development of three-dimensional memory die stack packages using polymer insulated sidewall technique, 1999.
Notice of Allowability, mailed Oct. 19, 2006 U.S. Appl. No. 11/090,969.
Advisory Action mailed Oct. 10, 2007, U.S. Appl. No. 11/016,558.
Advisory Action, mailed Oct. 20, 2008, U.S. Appl. No. 11/744,153.
Advisory Action, mailed Oct. 20, 2008, App. No. 111744,153.
Amendment A filed Aug. 7, 2006 in response to Feb. 7, 2006 Office Action, U.S. Appl. No. 11/097,829.
Amendment A filed Aug. 7, 2006 in response to Feb. 7, 2006 Quayle Action, U.S. Appl. No. 11/090,969.
Amendment and RCE filed Nov. 26, 2008 in response to Oct. 20, 2008 Advisory Action, U.S. Appl. No. 11/744,153.
Amendment and RCE filed Feb. 7, 2011 in repsonse to Aug. 5, 2010 Office Action, U.S. Appl. No. 12/143,157.
Amendment and RCE filed Mar. 16, 2011 in response to Mar. 18, 2010 Office Action, U.S. Appl. No. 11/744,142.
Amendment filed Jan. 18, 2011 in response to Aug. 18, 2010 Office Action, U.S. Appl. No. 12/046,651.
Amendment filed Jan. 21, 2011 in response to Jul. 21, 2010 Office Action, U.S. Appl. No. 11/849,162.
Amendment filed Jan. 22, 2007 in response to Jul. 19, 2007 Office Action, U.S. Appl. No. 11/016,558.
Amendment filed Jan. 24, 2007 in response to Jan. 8, 2007 Office Action, App. No. 111097,829.
Amendment filed Jan. 29, 2010 in response to Dec. 28, 2010 Office Action, U.S. Appl. No. 12/403,175.
Amendment filed Oct. 1, 2008 in response to Jul. 1, 2010 Office Action, U.S. Appl. No. 11/744,153.
Amendment filed Oct. 11, 2008 in response to Jul. 1, 2010 Office Action, App. No. 111744,153.
Amendment filed Oct. 14, 2008 in response to Sep. 15, 2008 Office Action, U.S. Appl. No. 11/016,558.
Amendment filed Nov. 9, 2009 in response to Oct. 7, 2009 Office Action, U.S. Appl. No. 11/849,162.
Amendment filed Nov. 9, 2009 in response to Oct. 7, 2009 Office Action, U.S. Appl. No. 12/143,157.
Amendment filed Dec. 3, 2009 in response to Aug. 3, 2009 Office Action, U.S. Appl. No. 11/744,142.
Amendment filed Dec. 3, 2009 in response to 813109 Office Action, U.S. Appl. No. 11/744,142.
Amendment filed Dec. 9, 2010 in response to Jun. 9, 2010 Office Action, U.S. Appl. No. 12/251,624.
Amendment filed Feb. 14, 2011 in response to Oct. 14, 2010 Office Action, U.S. Appl. No. 12/124,097.
Amendment filed Feb. 22, 2010 in response to Feb. 21, 2010 Office Action, U.S. Appl. No. 12/046,651.
Amendment filed Mar. 27, 2009 in response to Jan. 27, 2009 Office Action, U.S. Appl. No. 11/849,162.
Amendment filed Mar. 4, 2010 in response to Feb. 4, 2010 Office Action, U.S. Appl. No. 12/251,624.
Amendment filed Apr. 1, 2008 in response to Dec. 31, 2007 Office Action , U.S. Appl. No. 11/744,153.
Amendment filed Apr. 11, 2008 in response to Dec. 31, 2007 Office Action, U.S. Appl. No. 11/744,153.
Amendment filed Apr. 8, 2009 in response to Dec. 15, 2008 Office Action, U.S. Appl. No. 11/016,558.
Amendment filed May 22, 2009 in response to Apr. 20, 2009 Office Action, U.S. Appl. No. 11/744,142.
Amendment filed May 29, 2007 in response to Mar. 30, 2007 Notice, U.S. Appl. No. 11/097,829.
Amendment filed Jun. 21, 2007 in response to Dec. 22, 2006 Office Action, U.S. Appl. No. 11/016,558.
Amendment filed Jun. 27, 2008 in response to Mar. 27, 2008 Office Action, U.S. Appl. No. 11/016,558.
Amendment filed Jun. 30, 2009 in response to Dec. 30, 2009 Office Action, U.S. Appl. No. 12/143,157.
Amendment filed Jul. 26, 2010 in response to May 24, 2010 Office Action, U.S. Appl. No. 12/124,097.
Amendment filed Jul. 8, 2009 in response to Jun. 24, 2009 Office Action, U.S. Appl. No. 11/849,162.
Amendment filed Sep. 19, 2007 in response to Jul. 19, 2007 Office Action, U.S. Appl. No. 11/016,558.
EP Supplemental Search Report mailed Nov. 5, 2007, EP Application No. 05736129.7.
EP Supplementary Search Report dated Jun. 5, 2008 and mailed Jun. 12, 2008 for EP App. No. 05735136.3.
EP Supplementary Search Report mailed Jun. 5, 2008, EP App. No. 05735136.3.
Ex Parte Quayle Action mailed 217/06, U.S. Appl. No. 11/090,969.
Final Office Action mailed 118/07, U.S. Appl. No. 11/097,829.
Final Office Action mailed Mar. 1, 2011, U.S. Appl. No. 12/251,624.
Final Office Action mailed Mar. 18, 2010, U.S. Appl. No. 11/744,142.
Final Office Action mailed Mar. 18, 2010, App No. 111744,142.
Final Office Action mailed Jul. 1, 2010, U.S. Appl. No. 11/744,153.
Final Office Action mailed Jul. 19, 2007, U.S. Appl. No. 11/016,558.
Office Action mailed Aug. 18, 2010, U.S. Appl. No. 12/046,651.
Office Action mailed Aug. 3, 2009, U.S. Appl. No. 11/744,142.
Office Action mailed Aug. 3, 2009, App No. 111744,142.
Response filed Oct. 19, 2007 to Oct. 10, 2007 Advisory Action, U.S. Appl. No. 11/016,558.
Response filed Aug. 5, 2009 in response to Jul. 15, 2009 Office Action, U.S. Appl. No. 11/016,558.
Supplemental Amendement filed Aug. 5, 2009, App. No. 111849,162.
U.S. Appl. No. 12/124,097, filed May 20, 2008.
Written Opinion of the International Searching Authority for Application No. PCT/US2010/055472 dated Jul. 27, 2011.
Written Opinion of the International Searching Authority for Application No. PCT/US2009/067386 dated Jul. 1, 2010.
Written Opinion of the International Searching Authority for Application No. PCT/US2010/039639 dated Jan. 26, 2011.
Final Office Action mailed Sep. 15, 2008, U.S. Appl. No. 11/016,558.
Final Office Action, mailed Aug. 5, 2010, U.S. Appl. No. 12/143,157.
International Search Report & Wrillen Opinion, Application N90. PCT/US2008/066561, dated Dec. 31, 2008.
International Search Report and Wrillen Opinion, Appl. No. PCTIUS2008/067722, dated Feb. 25, 2009.

(56) References Cited

OTHER PUBLICATIONS

International Search Report and Written Opinion dated Apr. 12, 2010, App. No. PCTIUS2009/55421.
International Search Report and Written Opinion dated Mar. 17, 2009, App. No. PCTIUS2008/079948.
International Search Report and Written Opinion dated Jan. 26, 2011, App. No. PCT/US2010/39639.
International Search Report and Written Opinion dated Mar. 6, 2009, App. No. PCT/US2008/173365.
International Search Report and Written Opinion dated Oct. 6, 2009, App. No. PCTIUS2009/36921.
International Search Report and Written Opinion for Application No. PCT/US2009/047389 dated Jan. 14, 2010.
International Search Report and Written Opinion for Application No. PCT/US2010/054325 dated Jul. 28, 2011.
International Search Report and Written Opinion for PCT Application No. PCT/US2008/065788, mailed Sep. 30, 2008.
International Search Report for Application No. PCT/US2009/067386 dated Jul. 1, 2010.
International Search Report for Application No. PCT/US2010/039639 dated Jan. 26, 2011.
International Search Report for Application No. PCT/US2010/055472 dated Jul. 27, 2011.
International Search Report for PCT Application No. PCT/US2008/065793, mailed Dec. 22, 2008.
International Search Report mailed Mar. 23, 2009, International Application No. PCT/US2008/74450.
Japanese Office Action for Application No. 2010-550853 dated Sep. 18, 2013.
Notice of Allowability, mailed Oct. 19, 2006, U.S. Appl. No. 11/090,969.
Notice of Allowance mailed Dec. 17, 2009, U.S. Appl. No. 11/016,558.
Notice of Allowance mailed Feb. 27, 2009, U.S. Appl. No. 11/744,153.
Notice of Allowance, mailed Feb. 12, 2007, U.S. Appl. No. 11/097,829.
Notice of Appeal filed Sep. 16, 2010 in response to Mar. 18, 2010 Office Action, U.S. Appl. No. 11/744,142.
Notice to File Corrected Papers, mailed Mar. 30, 2007, U.S. Appl. No. 11/097,829.
Office Action (Restriction) mailed Jan. 21, 2010, U.S. Appl. No. 12/046,651.
Office Action (Restriction) mailed Oct. 7, 2009, U.S. Appl. No. 11/849,162.
Office Action (Restriction) mailed Oct. 7, 2009, U.S. Appl. No. 12/143,157.
Office Action (Restriction) mailed Dec. 28, 2010, U.S. Appl. No. 12/403,175.
Office Action (Restriction) mailed Feb. 4, 2010, U.S. Appl. No. 12/251,624.
Office Action (Restriction) mailed Apr. 20, 2009, U.S. Appl. No. 11/744,142.
Office Action (Restriction) mailed May 24, 2010, U.S. Appl. No. 12/124,097.
Office Action (Restriction) mailed Jun. 24, 2009, U.S. Appl. No. 11/849,162.
Office Action mailed Jan. 27, 2009, U.S. Appl. No. 11/849,162.
Office Action mailed Oct. 14, 2010, U.S. Appl. No. 12/124,097.
Office Action mailed Dec. 15, 2008, U.S. Appl. No. 11/016,558.
Office Action mailed Dec. 22, 2006, U.S. Appl. No. 11/016,558.
Office Action mailed Dec. 30, 2009, U.S. Appl. No. 12/143,157.
Office Action mailed Dec. 31, 2007, U.S. Appl. No. 11/744,153.
Office Action mailed Feb. 7, 2006, U.S. Appl. No. 11/097,829.
Office Action mailed 217106, U.S. Appl. No. 11/097,829.
Office Action mailed Mar. 1, 2011, U.S. Appl. No. 12/143,157.
Office Action mailed Mar. 19, 2008, EP Application No. 05736129.7.
Office Action mailed Mar. 27, 2008, U.S. Appl. No. 11/016,558.
Office Action mailed Jun. 9, 2010, U.S. Appl. No. 12/251,624.
Office Action mailed Jul. 15, 2009, U.S. Appl. No. 11/016,558.
Office Action mailed Jul. 21, 2010, U.S. Appl. No. 11/849,162.
Taiwanese Office Action for Application No. 098108067 dated Dec. 25, 2013.
Chinese Office Action for Application No. 200980149285.2 dated Feb. 28, 2014.
International Search Report and Written Opinion, PCT/US08/09207, dated Jan. 16, 2009.
International Search Report and Written Opnion, PCT/US2007/021552 dated May 29, 2008.
International Search Report, PCT/US2009/003643, dated Aug. 28, 2009.
Japanese Office Action for Application No. 2011540873 dated Jan. 22, 2014.
Amendment filed Mar. 1, 2010, U.S. Appl. No. 12/142,589, in response to Office Action mailed Dec. 1, 2009.
International Preliminary Report on Patentability for Application PCT/US2008/067541 mailed Jan. 7, 2010.
International Search Report for PCT Application No. PCT/US2008/067541 mailed Oct. 27, 2008.
Japanese Office Action for Application No. 2012-517680 dated Jul. 25, 2014.
Office Action mailed Dec. 1, 2009, U.S. Appl. No. 12/142,589, titled "Wafer level surface passivation of stackable integrated circuit chips".
Chinese Office Action for Application No. 201080035256.6 dated Jul. 17, 2014.
Taiwanese Office Action for Application No. 098119939 dated Aug. 29, 2014.
Chinese Office Action for Application No. 201180031606.6 dated Dec. 11, 2014.
Taiwanese Office Action for Application No. 099136720 dated May 18, 2015.
Japanese Office Action for Application No. 2012-517680 dated Jun. 1, 2015.

* cited by examiner

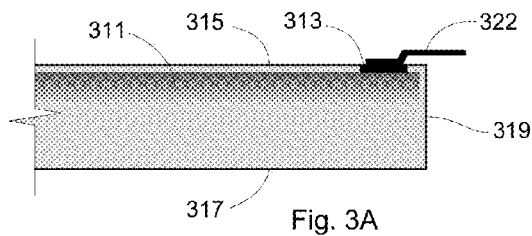
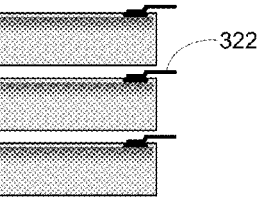
Fig. 3A · Fig. 4A
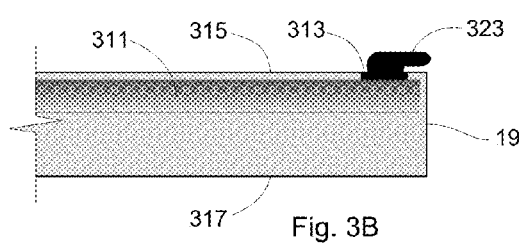
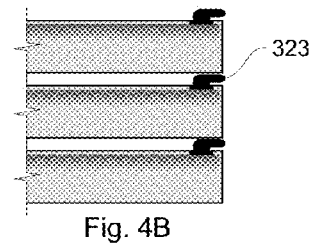
Fig. 3B · Fig. 4B
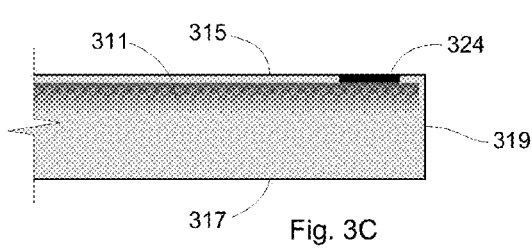
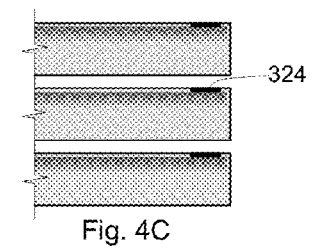
Fig. 3C · Fig. 4C
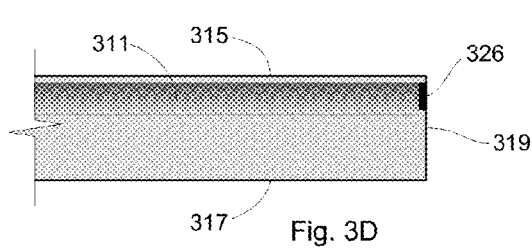
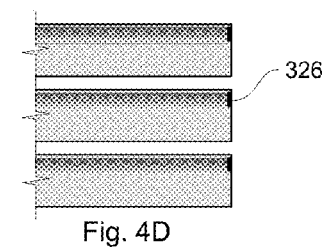
Fig. 3D · Fig. 4D
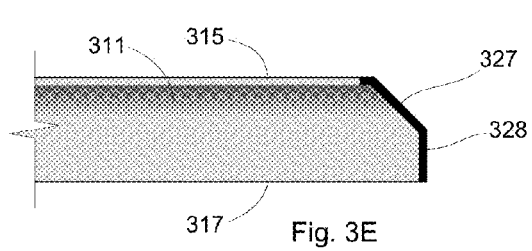
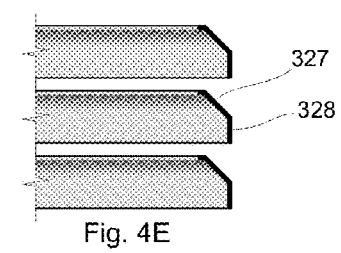
Fig. 3E · Fig. 4E
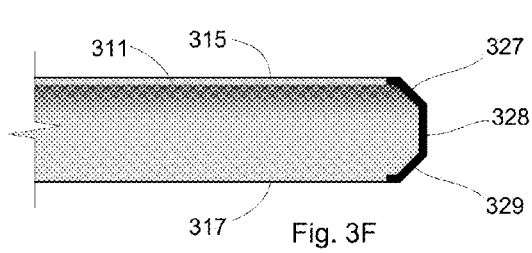
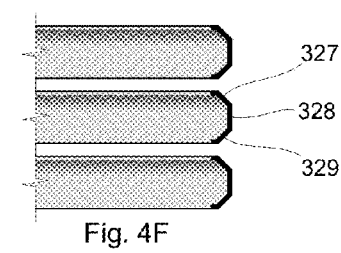
Fig. 3F · Fig. 4F

SUPPORT MOUNTED ELECTRICALLY INTERCONNECTED DIE ASSEMBLY

CROSS-REFERENCE TO RELATED APPLICATIONS

This application is a continuation of U.S. patent application Ser. No. 12/403,175 filed Mar. 12, 2009, now U.S. Pat. No. 8,178,978, which claims the benefit of U.S. Provisional Application No. 61/035,989 filed Mar. 12, 2008, each of which applications is hereby incorporated herein by reference.

This application is related to U.S. patent application Ser. No. 12/124,077, to McElrea et al. and to Caskey et al., each of which was filed May 20, 2008, and each of which is hereby incorporated by reference herein.

BACKGROUND

This invention relates to electrical interconnection of integrated circuit chips and, particularly, to mounting interconnected stacked die onto a support.

A typical semiconductor die has a front ("active") side, in which the integrated circuitry is formed, a back side, and sidewalls. The sidewalls meet the front side at front edges and the back side at back edges. Semiconductor die typically are provided with interconnect pads (die pads) located at the front side for electrical interconnection of the circuitry on the die with other circuitry in the device in which the die is deployed. Some die as provided have die pads on the front side along one or more of the die margins, and these may be referred to as peripheral pad die. Other die as provided have die pads arranged in one or two rows at the front side near the center of the die, and these may be referred to as center pad die. The die may be "rerouted" to provide a suitable arrangement of interconnect pads at or near one or more of the margins of the die.

Semiconductor die may be electrically connected with other circuitry in a package, for example on a package substrate or on a leadframe, by any of several means. Such z-interconnection may be made, for example, by wire bonds, or by flip chip interconnects, or by tab interconnects. The package substrate or leadframe provides for electrical connection of the package to underlying circuitry (second-level interconnection), such as circuitry on a printed circuit board, in a device in which the package is installed for use.

A number of approaches have been proposed for increasing the density of active semiconductor circuitry in integrated circuit chip packages, while minimizing package size (package footprint, package thickness). In one approach to making a high density package having a smaller footprint, two or more semiconductor die, of the same or different functionality, are stacked one over another and mounted on a package substrate.

The disclosure of U.S. Pat. No. 7,245,021 describes a vertically stacked die assembly including a plurality of integrated circuit die electrically interconnected by "vertical conducting elements". The die are covered with an electrically insulative conformal coating. The vertical conducting elements are formed of a conductive polymer material, applied adjacent the edge of the die. The die are provided with metallic conducting elements, each having one end attached to electrical connection points at the die periphery and having the other end embedded in a vertical conducting polymer element. The disclosure of U.S. Pat. No. 7,215,018 describes a similar vertically stacked die assembly mounted onto a ball grid array ("BGA") or land grid array ("LGA") substrate. The stacked die assembly is mounted onto the BGA or LGA substrate by electrical and physical connection of the vertical conducting elements ("vertical interconnects") to electrical connection lands on the surface of the substrate. The electrical connection is said to be done by use of a conductive polymer "dot" or "puddle" between the vertical interconnect of the stack of die and the substrate. The patent discloses that the substrate can include means for making electrical connection between the bottom of the substrate and a printed circuit board, such as solder balls or bumps, or "LGA contacts" on the bottom of the substrate.

SUMMARY

In various embodiments the invention features electrical connection of stacked die assemblies to connection sites on any support, without electrical connection to any interposed die or substrate or leadframe or package. Each die in the stacked die assembly has peripheral interconnect terminals, and the die in the stack are electrically interconnected by lines or traces of an electrically conductive material, which may be an electrically conductive polymer, or an electrically conductive ink, that contacts interconnect terminals on the respective die. The interconnect material may include a curable polymer. The stacked die assembly may be mounted directly onto a surface of the support to which the die stack assembly is electrically connected. Or, the stacked die assembly may be mounted onto a surface of an additional support (such as an additional die or substrate or leadframe or package) and electrically connected to connection sites on the support. In some embodiments the additional support includes a semiconductor construct that is electrically connected to additional connection sites on the support to which the stacked die assembly is electrically connected.

In one general aspect the invention features a support having electrical connection sites at a surface thereof, and a stacked die assembly mounted onto the surface and electrically connected to one or more of the connection sites, wherein each die in the stacked die assembly has peripheral interconnect terminals, and the die in the stack are electrically interconnected by lines or traces of an electrically conductive material, which may be an electrically conductive polymer, or an electrically conductive ink, that contacts interconnect terminals on the respective die.

In some embodiments the traces of electrically conductive material that interconnect the die in the stack may also connect to the connection sites on the support. In such embodiments the die stack is positioned on or in relation to the support so that the interconnect terminals on the die are suitably aligned with corresponding connection sites on the support circuitry, and then the interconnect material is applied in a suitable pattern over the interconnect terminal on the die and the connection sites on the support. And in such embodiments where the interconnect material includes a curable polymer, the material may be cured following the application of the curable material to the die and the connection sites.

In other embodiments an additional quantity of an electrically conductive material may be provided to make contact between the die stack interconnects and the connection sites on the support. In some such embodiments the die stack assembly interconnection is completed prior to positioning the assembly on or in relation to the support, and in such embodiments where the interconnect material includes a curable polymer, the material may be cured or partially cured following the application of the curable material to the die and prior to positioning the assembly on or in relation to the support. Cured or partially cured interconnects can improve mechanical stability of the stack assembly during subsequent handling, such as during installation of the assembly on the support. The additional material may be applied to the connection sites on the support, or to contact sites on the interconnects, prior to positioning the assembly on or in relation to the support. The additional material may be the same as, or may be different from, the material of the die stack interconnects; and, where the additional material is a curable polymer, a final cure is carried out following the positioning of the assembly on or in relation to the support.

In another general aspect the invention features a first support having electrical connection sites at a surface thereof, a second support mounted on the first support, and a stacked die assembly mounted onto a surface of the second support and electrically connected to one or more of the connection sites on the first support, wherein each die in the stacked die assembly has peripheral interconnect terminals, and the die in the stack are electrically interconnected by lines or traces of an electrically conductive material, which may be an electrically conductive polymer, or an electrically conductive ink, that contacts interconnect terminals on the respective die.

In some embodiments the additional support is electrically connected to the first support. In such embodiments at least some of the electrical connections of the die in the stacked die units or assemblies are not electrically connected to the additional support and, in some such embodiments there is no direct electrical connection between the die unit or assembly and interconnect pads or sites on the additional support.

In some embodiments the additional support serves as a mechanical or structural support for the die assembly or unit, and includes no electrical or electronic components. It may include, for example, a dummy die; or a sheet of dielectric material; or a heat dissipating sheet or block of a material having a high heat capacity or high thermal conductivity.

In some embodiments the additional support may include only passive electrical features. The passive electrical features in the additional support may be electrically connected to one or more sites in the first support; or they may be connected to a selected number (less than all) of the interconnections in the die unit or assembly; or they may be connected to a selected number (less than all) of the interconnections in the die unit or assembly as well as to one or more sites in the support. In such embodiments the additional support may include, for example, a ground plane.

In some embodiments the additional support may include electronic circuitry, and may include one or more semiconductor devices. For example, the additional support may be a semiconductor package; or an additional die. In some such examples one or more connection sites in the additional support may be electrically connected to sites in the first support; or to a selected number (less than all) of the interconnections in the die unit or assembly; or to a selected number (less than all) of the interconnections in the die unit or assembly as well as to one or more sites in the support.

In particular embodiments where the additional support includes electronic circuitry, the electronic circuitry in the second support and the die assembly or unit are separately connected to the first support. That is, the electrical connections between the die assembly or unit and the first support bypass the second support, and the respective connections may be made to separate sets of sites on the first support. In some such embodiments the additional support is a die; pads on the die are connected to a second set of bond sites on the first support, and interconnects in the die assembly or unit are connected to a first set of bond sites on the first support. In other such embodiments the additional support is a semiconductor package, and lands on the package are connected to a second set of bond pads on the first support, and interconnects in the die assembly or unit are connected to a first set of bond sites on the first support.

Installation of the die stack and electrical connection of the die to connection sites on the support according to the invention requires no solder, or wires, sockets, pins, or other connectors.

In some embodiments the interconnect material is an electrically conductive polymer, such as an electrically conductive epoxy, for example; or an electrically conductive ink. In some embodiments the electrically conductive polymer is a curable polymer, and may be curable in stages. The interconnect material may include, for example, a matrix containing an electrically conductive filler; the matrix may be a curable or settable material, and the electrically conductive fill may be in particulate form, for example, such that when the matrix sets or is cured, the material is itself electrically conductive. In some embodiments the material is a conductive epoxy such as a silver filled epoxy; for example, a filled epoxy having 60-90% (more usually 80-85%) silver may be suitable. The epoxy is cured following dispensing, resulting in some embodiments in a fusion of the series of dots into a continuous interconnect strand.

In some embodiments, where connection of the stack to the support is made in the same operation as interconnection of the die in the stack, the interconnect material can be applied using an application tool such as, for example, a syringe or a nozzle or a needle. The material exits the tool in a deposition direction generally toward the die pads or interconnect terminals, and the tool is moved over the presented stack face in a work direction. The material may be extruded from the tool in a continuous flow, or, the material may exit the tool dropwise. In some embodiments the material exits the tool as a jet of droplets, and is deposited as dots which coalesce upon contact, or following contact, with a stack face surface. In some embodiments the deposition direction is generally perpendicular to the sidewall surface of the die, and in other embodiments the deposition direction is at an angle off perpendicular to the sidewall surface of the die. The tool may be moved in a generally linear work direction, or in a zig-zag work direction, depending upon the location on the various die of the corresponding terminals to be connected.

In some embodiments a plurality of interconnect traces are formed in a single operation, and in some such embodiments all the interconnect traces on a given stacked assembly are formed in a single operation (or in a number of operations fewer than the number of traces). The application tool may in such instances include a number of needles or nozzles ganged together in a row generally parallel to the die edges.

In some embodiments the interconnects are applied by printing, for example using a print head (which may have a suitable array of nozzles), or for example by screen printing or using a mask. In some embodiments the interconnects are formed using a photosensitive material, and photoexposure procedure to pattern the material. For example, the material may be a photocurable electrically conductive material, such as a metal-filled photopolymerizable organic polymer, for example; and the material is applied generally over an area that includes pads or interconnect terminals, then is exposed to light in the desired patterned, and the uncured material is removed.

In other embodiments where an electrically interconnected die stack is connected to the support using an additional small amount of interconnect material between the die stack interconnects and the connection sites on the support, the additional small amount of material may be applied to the die stack interconnects in a transfer operation, for example by dipping shallowly into a reservoir of the interconnect material, or by screen printing or stencil printing, for example.

In still other embodiments where an electrically interconnected die stack is connected to the support using an additional small amount of interconnect material between the die stack interconnects and the connection sites on the support, the additional small amount of material may be applied to the connection sites on the support by a dispense operation. The material may be dispensed using an application tool, and the material may exit the tool under control of an apparatus using pressure dispense (for example under a controlled time and pressure regime), piston dispense (for example under a controlled time and piston travel regime), or auger dispense (for example under a controlled time and auger rotation regime). Or, the material may be applied to the connection sites on the support by a patterned print operation, using for example an array of jets or apertures. The material may be dispensed by droplets, or in a continuous stream.

According to the invention the stacked die assembly can be electrically connected directly onto any electrical connection sites on any support, using an electrically conductive polymer or electrically conductive ink. Suitable supports include, in one general category, any dielectric substrate carrying patterned electrical conductors in one or more layers. The dielectric substrate may be or include a natural or synthetic organic or inorganic material. For example, circuitry formed on or in a glass or ceramic or silicon or other dielectric sheet or film can constitute a suitable support. Other suitable supports include conventional circuit boards such as printed circuit boards, which may be, for example, motherboards, or module boards, or daughterboards.

In another general aspect the invention features stacked die units or stacked die assemblies electrically interconnected with circuitry on a support in a device for use. In some embodiments the stacked die assembly is interconnected such that the active side of the die faces toward the underlying circuitry; in other embodiments the stacked die assembly is interconnected such that the back side of the die faces toward the underlying circuitry. In other embodiments one or more die in the stack may be oriented facing away from the underlying circuitry while one or more other die in the stack face toward the underlying circuitry. In still other embodiments the die or the stack of die is oriented so that the plane of the die is nonparallel with the die mount surface of the support; in some such embodiments the plane of the die is oriented perpendicular to the plane of the die mount surface of the support; or is oriented at some other angle between parallel and perpendicular.

In some embodiments the die are provided with an electrically insulative conformal coating over at least the front surface and the sidewalls adjacent the die margin on which the interconnect pads are arranged, and in some such embodiments the die are provided with a electrically insulative conformal coating over the front surface, the back surface, and the sidewall surfaces of the die.

The conformal coating protects the die during assembly, and serves to electrically insulate the die from electrically conductive parts that it may contact. In some embodiments the material of the conformal coating includes an organic polymer, for example a polymer of p-xylene or a derivative thereof, such as a polyxylylene polymer, e.g., a parylene C or a parylene N, or a parylene A, or a parylene SR. In some embodiments the conformal coating is formed by deposition, for example by vapor deposition, or liquid phase deposition, or by solid phase deposition.

In some embodiments an underfill material is applied between the die stack and the support. In some embodiments it may be preferred to select an underfill material that is rigid, to provide mechanical stability to the die and support assembly.

The assemblies according to the invention can be used for building computers, telecommunications equipment, and consumer and industrial electronics devices.

BRIEF DESCRIPTION OF THE DRAWINGS

FIGS. 3A-3F are diagrammatic sketches in sectional view showing examples of various die edge configurations.

FIGS. 4A-4F are diagrammatic sketches in sectional view showing stacks of die having die edge configurations as in FIGS. 3A-3F.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention. At some points in the description, terms of relative positions such as "above", "below", "upper", "lower", "top", "bottom" and the like may be used, with reference to the orientation of the drawings; such terms are not intended to limit the orientation of the device in use.

Figure 1:
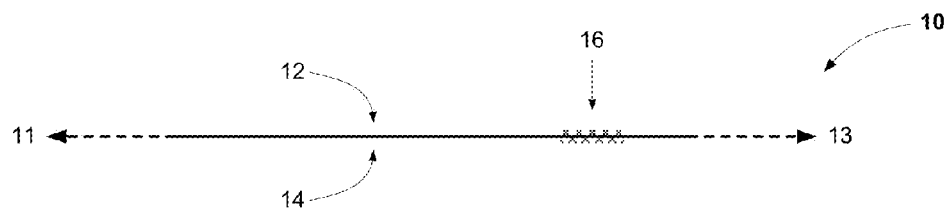
FIG. 1 is a diagrammatic representation illustrating a generalized support to which a die assembly can be electrically connected according to the invention.

According to the invention, stacked die assemblies are electrically connected to interconnect sites on any support, without an interposed substrate or leadframe; and electrical interconnection of the die in the stack, and of the die stack to the support, is made by way of an electrically conductive polymer or an electrically conductive ink, without solder, or wires, sockets, pins, or other connectors. FIG. 1 illustrates symbolically in a sectional view a generalized support 10, having a connection side 12 and a reverse side 14. Interconnect sites 16 are present at least at the connection side of the support. The thickness of the support is not indicated in the FIG., as the support may range from very thick to very thin, depending among other things upon the character of the support; for instance, a printed circuit board may have a greater thickness than substrate having two metal layers separated by a single dielectric layer. The support may have greater or lesser length and width dimensions, as suggested by dashed arrows 11 and 13. The die stack may be directly connected to interconnect sites at an attachment side of any of a wide variety of categories of supports, including for example: other die, including for example logic chips; other die stacks; other packaged devices or components; circuit boards, including system circuit boards, motherboards, daughterboards, module boards, and the like; leadframes; and the like.

Figure 2:
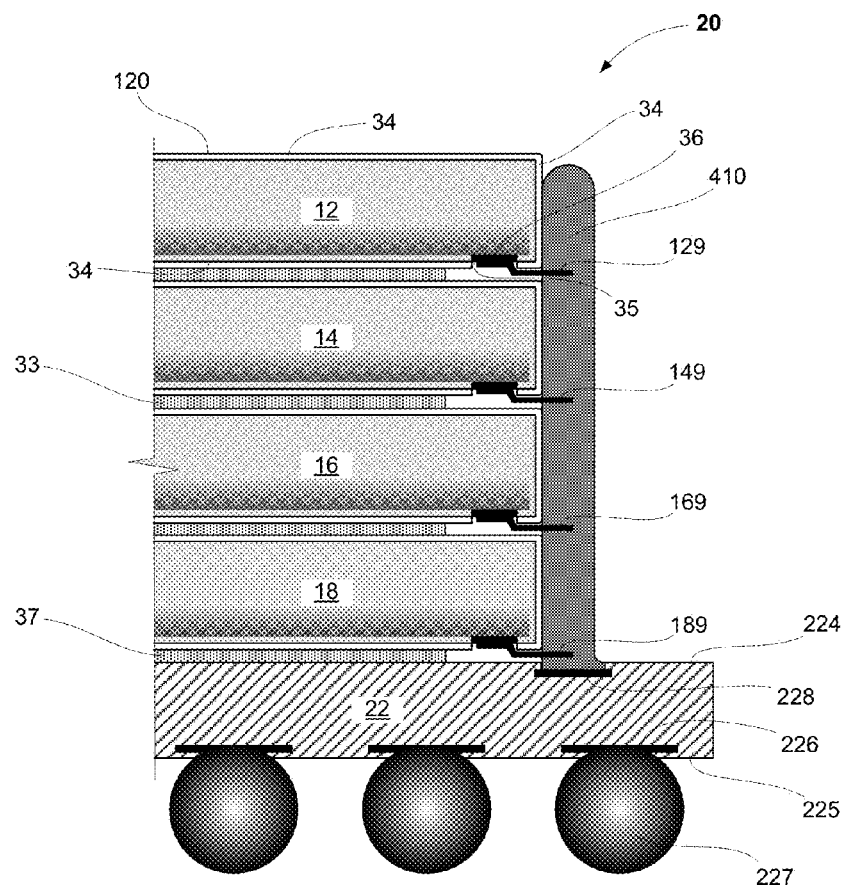
FIG. 2 is a diagrammatic sketch in partial sectional view showing a stack of four die mounted on a BGA substrate.

As noted above in background, U.S. Pat. No. 7,215,018 describes a vertically stacked die assembly mounted onto a ball grid array ("BGA") or land grid array ("LGA") substrate. The die in the stack are electrically interconnected, and the stack is electrically connected to the substrate, using a curable electrically conductive polymer. FIG. 2 shows generally at 20 such a stack 21 of four die 12, 14, 16, 18 mounted on a BGA substrate 22 in a partial sectional view. In this example each die, e.g., die 12, is covered by an electrically insulative conformal coating 34; the coating covers the backside 120, the sidewalls, and the front side of the die, with openings (e.g. opening 35) in the coating over the die pads (e.g., pad 36), exposing an area of the pad for connection of an interconnect terminal (e.g., off-die terminal 129).

Adjacent die in the stack may optionally be mounted one upon the other using an adhesive. (The term "adjacent" with reference to die in a stack means the die are vertically adjacent; die may also be horizontally adjacent, for example in a wafer or in a die array or, in some configurations, on a common support.). In the example shown here, a film adhesive piece is employed (e.g., 33 between adjacent die 14 and 16).

Bond pads 228 are arranged at the die mount surface 224 of the substrate 22. In the example shown, the die are arranged one over another with the respective interconnect terminals 129, 149, 169, 189 aligned vertically (that is, generally perpendicular to the front or back side of the die). And, in the example shown, the die stack 21 is mounted on the substrate with the respective interconnect terminals aligned at least partly over the respective bond pad 228. Solder balls 227 are attached in a reflow process to an array of lands 226 exposed at the side of the substrate 225 opposite the die mount side 224. The array of solder balls provides for second-level interconnection of the assembly 20 onto underlying circuitry in a device for use, for example on a leadframe, or a printed circuit board, for example.

The die stack may be mounted on the substrate using an adhesive. In the example shown here, the die 18 adjacent the substrate 22 is affixed to the die mount side 224 of the substrate 22 using a film adhesive 37. As may be appreciated, a configuration as shown in FIG. 2 may be made by forming the die stack and then mounting the die stack on a substrate 22; or, alternatively, it may be made in a build-up manner, by stacking the die serially on the substrate, that is by mounting die 18 on the substrate 22 (optionally using an adhesive 37), then mounting die 16 on die 18 (optionally using an adhesive 33), then mounting die 14 on die 18, etc., and then applying the interconnect material to the terminals on the die as well as to the bond pad on the substrate in a continuous operation.

FIG. 2 shows the stacked die assembly on the substrate following cure of the interconnect. The assembly in this example has a stack of four die mounted on a substrate, in which the die are electrically interconnected to one another, and to the substrate circuitry (z-interconnection) by the interconnect 410; that is the interconnect 410 provides electrical continuity between the interconnect terminals 129, 149, 169, 189 and the bond pad 228 on the substrate 22.

FIGS. 3A-3F show examples of various die edge configurations in die to be interconnected according to various embodiments of the invention.

FIG. 3A shows a die having an "off-die" interconnect. The die is shown in a partial sectional view, having an active side 315 at which the integrated circuitry 311 of the die is formed, and a die sidewall 319. In an off die configuration an interconnect terminal 322 is bonded to an interconnect pad (die pad) 313. The die pad may be a peripheral die pad in the die as provided, or it may be situated at or near the die periphery as a result of rerouting of the die circuitry. The interconnect terminal may be, for example, a wire (formed for example in a wire bond operation) or a tab or ribbon (formed for example in a ribbon bond operation). The interconnect terminal 322 extends outwardly beyond the die edge 319 (hence, "off-die" terminal).

FIG. 3B shows a die having a bump or glob 323 of an electrically conductive polymer material deposited onto the die pad 313. The glob may be shaped so that it extends toward the die edge, and may extend to the die edge or (as in the example shown in FIG. 3B) slightly beyond the die edge 19; it may be in the shape of a thumb, for example. Alternatively, the glob may be formed entirely above the pad, as shown for example in FIG. 5B. The conductive polymer material may be, for example, a curable conductive polymer such as a conductive epoxy.

FIG. 3C shows a die having an interconnect terminal 324 formed in or at the active side of the die, at or near the margin of the die where the active side 315 of the die meets the die sidewall 319. Such a marginal interconnect terminal may be an extension of a die pad, for example, and may be situated at or near the die margin as a result of rerouting of the die circuitry.

FIG. 3D shows a die having an interconnect terminal 326 formed in the die sidewall 319. The interconnect terminal may be connected to the integrated circuitry of the die by attachment of a pad of conductive material to an extension of the die pad, for example, or to rerouting circuitry.

FIG. 3E shows a die having an interconnect terminal formed so that it wraps around a chamfer that is formed at the front side die edge (at the intersection of the die sidewall 319 with active side 315 of the die). Such a wraparound terminal has a terminal portion 327 on the chamfer, and a terminal portion 328 on the die sidewall. A similar wraparound terminal may be formed over the back side die edge (at the intersection of the die sidewall with back side 317 of the die), where no chamfer is present.

FIG. 3F shows a die having an interconnect terminal formed so that it wraps around a chamfer that is formed at the front side die edge (at the intersection of the die sidewall with active side 315 of the die), and further around a chamfer that is formed at the back side die edge (at the intersection of the die sidewall with back side 317 of the die). Such a wraparound terminal has a terminal portion 327 on the front edge chamfer, and a terminal portion 328 on the die sidewall, and a terminal portion 329 on the back edge chamfer.

FIGS. 4A-4F show arrangements of die as in, respectively, FIGS. 3A-3F, oriented one over another (in these examples, each having three die in the stack). The die are shown "vertically" arranged; that is, they are aligned generally vertically with respect to an arbitrarily assigned "horizontal" plane of the front or back sides of the die, and, accordingly, they may be vertically interconnected at the vertical stack face, for example using a trace of electrically conductive epoxy.

As FIGS. 4A and 4B show, the off-die terminals 322, 323 project at the stack face, making them available for connection by a variety of methods. As FIG. 4C shows, interconnect terminals 324 in the margin of the active side of the die are beneath the margins of die stacked over them (except that the active side of one of the die is exposed and readily accessible for interconnection). As FIGS. 4D, 4E, and 4F show, by contrast, interconnect terminals 326 formed in the die edge (FIG. 4D), and wraparound interconnect terminals 327, 328 (FIG. 4E) or 327, 328, 329 (FIG. 4F) are presented at the stack face for interconnection.

FIGS. 5A-5F show stacked die arranged generally as in FIGS. 4A-4F, respectively. Here each die 52 is covered with a conformal insulative coating 54, having openings 55 over the die pads.

Figure 5A:
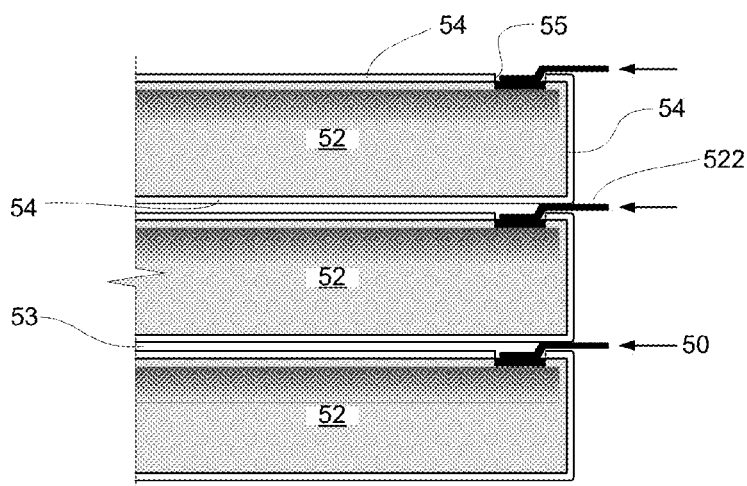
FIGS. 5A-5F are diagrammatic sketches in sectional view showing stacks of die having die edge configurations as in FIGS. 3A-3F, in which the respective die are covered by a conformal dielectric coating.

FIG. 5A shows a three-die stack of die having off-die terminals 522. Because the off die interconnect terminals in this example stand above the front side of the die, adjacent die in the stack are separated by a space 53. A spacer may optionally be interposed in the space 53 to support adjacent die; optionally the spacer may be a film adhesive of suitable thickness both to fill the space and to affix the die to one another. The off-die interconnect terminals 522 are vertically aligned, and are presented at the stack face as indicated by arrows 50, so that they may be readily interconnected using, for example, a vertically-oriented interconnect, as described generally in U.S. Pat. No. 7,245,021, for example.

Figure 5B:
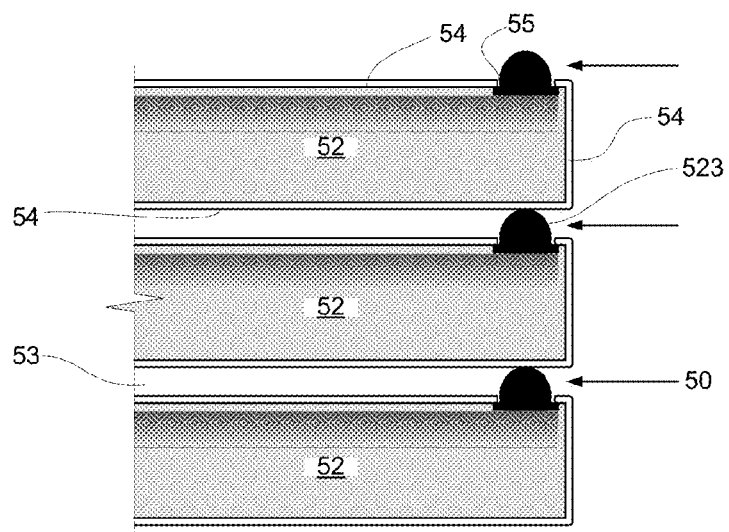

FIG. 5B shows a three-die stack of die having globs 523 of an electrically conductive polymer material deposited onto the die pad. In the example shown here, the glob is formed entirely above the exposed die pad, and does not extend toward the stack face (compare, FIGS. 3B, 4B. As in the example of FIG. 5A, the globs stand above the front side of the die, so that adjacent die in the stack are separated by a space 53 and, optionally, a spacer may be interposed in the space 53 to support adjacent die; and optionally the spacer may be a film adhesive of suitable thickness both to fill the space and to affix the die to one another. Although the glob 523 in this example does not extend toward the stack face, it permits access to a portion of the interconnect material (not shown in this FIG.) that intrudes into the space between the die at the die edge, as suggested by the arrows 50.

Figure 5C:
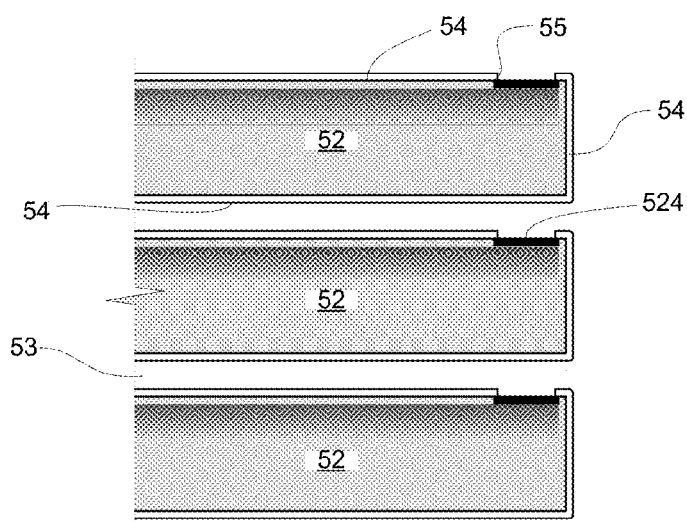

FIG. 5C shows a three-die stack of die having an interconnect terminal 524 formed in or at the active side of the die, at or near the margin of the die where the active side of the die meets the die sidewall. In such a configuration the interconnect terminals 524 of lower die in the stack (that is, all the die except the uppermost die in the stack) are overlain by die stacked over them. Interconnection of die in such a stack may be made by a vertically-oriented interconnect at the stack face, provided that the interconnect intrudes between adjacent die onto the interconnect terminals 524. For example, the interconnect material as applied (such as an electrically conductive epoxy) has some capacity to flow into the space at the margin between adjacent die, to make electrical connection with interconnect terminals in the margin at the active side of the die. This necessitates providing a separation 53 between adjacent die sufficient to permit the intrusion. As in the configuration shown in FIG. 5A, a spacer may optionally be interposed in the space 53 to support adjacent die; and optionally the spacer may be a film adhesive of suitable thickness both to fill the space and to affix the die to one another.

Figure 5D:
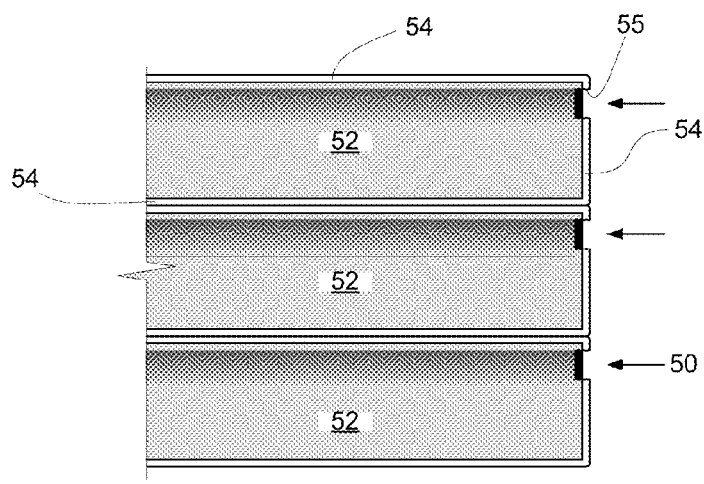
Figure 5E:
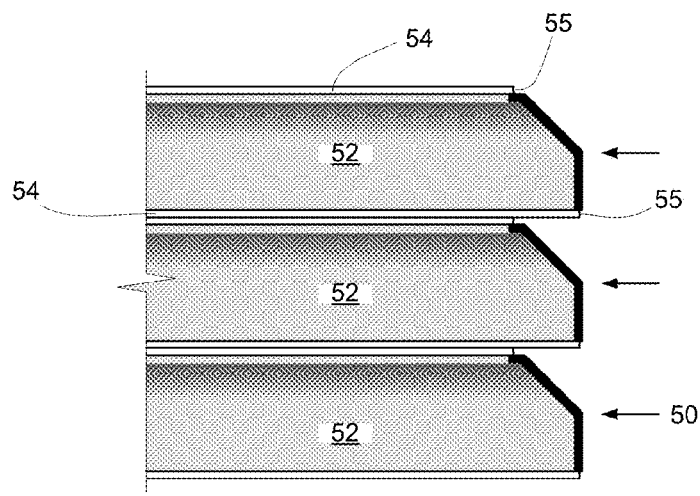
Figure 5F:
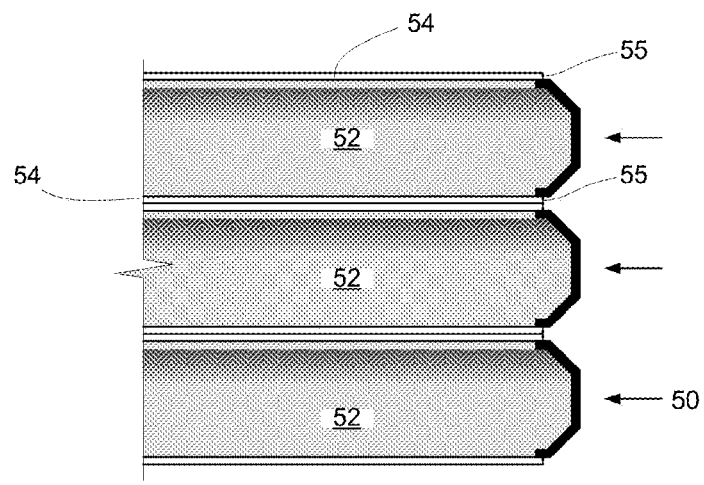

Each of FIGS. 5D, 5E, and 5F shows a three-die stack of die having an interconnect terminal formed in or at the die sidewall and presented at the stack face as shown by the arrows 50. In these examples the conformal coating covers at least the front side and the back side of the die. Such a configuration may be made by coating the entirety of all surfaces of the die and then forming openings through the coating to expose the underlying interconnect terminals; or such a configuration may be made by coating only the front surface and the back surface of the die, leaving the interconnect terminals uncoated. Because the interconnect terminals are presented at the stack face, and because the interconnect terminals do not stand above the front side of the die, no space is required between adjacent die in the stack. Accordingly, as the FIGs. illustrate, the surface of the coating at the backside of an upper die can rest directly upon the surface of the coating on the front ("active") side of the adjacent lower die in the stack.

Stacked die in configurations as shown for example in FIGS. 5D, 5E, and 5F can be readily interconnected using, for example, an interconnect applied to the stack face, that is, by an interconnect applied to the sidewalls of the die in the stack. Die in a stack electrically interconnected in this manner can according to the invention be electrically connected with connection sites on any of a variety of supports by direct connection without use of solder and without any interposed substrate or leadframe.

In the examples illustrated above, the die are stacked so that the die sidewalls are vertically aligned, substantially flush with an imaginary plane perpendicular to the plane of the x-y plane of the die, the plane being referred to at some points as the stack face. Because the interconnect material is applied in a generally liquid state, the interconnect material as applied is flowable or deformable to some extent. Accordingly, misalignment of the die sidewalls can be tolerated without compromising the integrity of the interconnections.

In some embodiments the die are offset by design, so that the stack has a stepped configuration at the die edges having interconnect terminals to be interconnected. This may be particularly useful where the interconnect terminals are not directly accessible at the die sidewall, for example as for die configured as shown in FIG. 5C. An interconnected die stack having offset die is shown by way of example in FIGS. 6A, 6B.

Figure 6A:
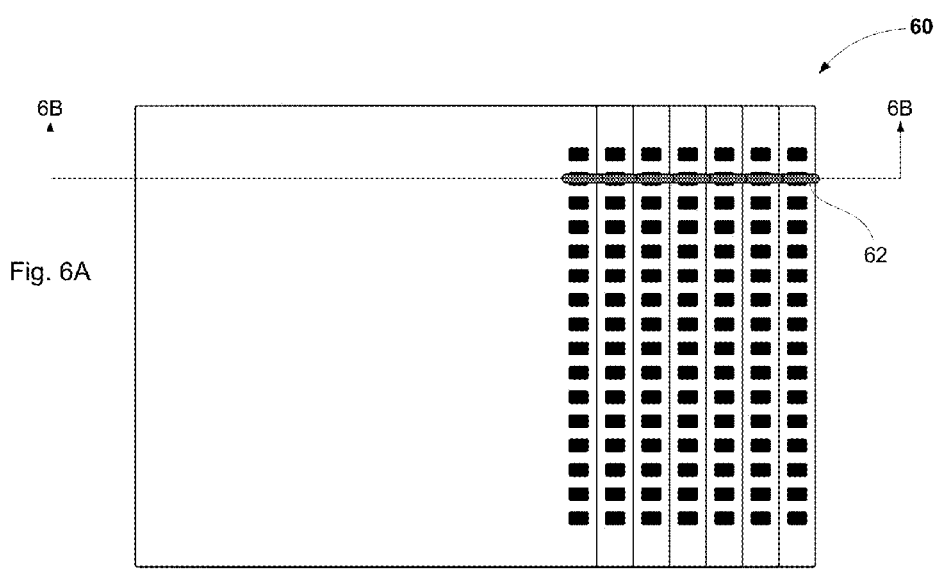
FIGS. 6A, 6B are diagrammatic sketches in plan and sectional views illustrating die stacked in an offset configuration.
Figure 6B:
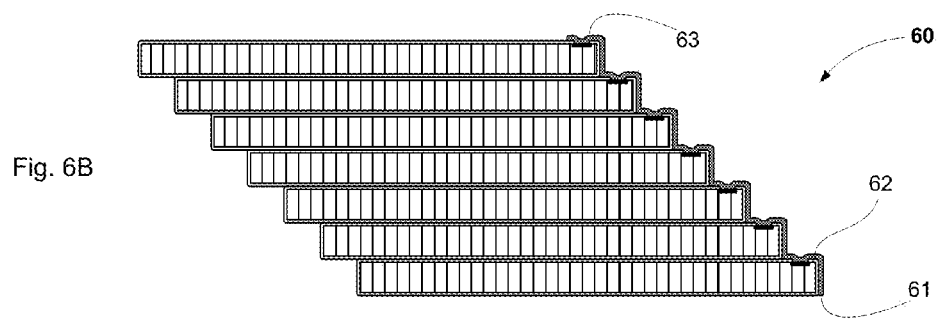

FIG. 6A shows in a plan view an arrangement of stacked die, each die having interconnect terminals arranged in one margin adjacent a front die edge, and showing interconnect material formed over corresponding interconnect terminals; and FIG. 6B shows the stack in a sectional view as indicated at 6B-6B in FIG. 6A. Referring to the uppermost die in the stack, for example, the interconnect terminals are in this example situated in a row alongside a front die edge. The die in this example is covered on all surfaces (back surface, front surface, sidewalls) by a conformal coating, provided with openings exposing the interconnect terminals. Successive coated die in the stack may, as in these examples, rest directly one upon another, such that the coating on the back side of an upper die can contact the coating on the front side of the underlying die.

In the example shown in FIGS. 6A and 6B the die are all of the same size, and the pads are located along only one die edge. Accordingly, successive die in the stack are displaced only in a direction orthogonal to a die edge along which the pads are situated.

Each die need be displaced only to an extent at least sufficient to expose enough of the area of the pads in the underlying die to permit the interconnect material to make reliable electrical contact with the pads and, accordingly, the extent of displacement, indicated for example at d in the FIGs., is shown greater than necessary. In principle, the displacement may be sufficient if at least a fraction of the area of the pads is left uncovered by the overlying die. In practice, if the uncovered area of a pad is too small, the interconnect material as deposited may not contact the pad over an area great enough to establish a reliable electrical connection when the material is cured. It may be preferred to minimize the extent of displacement, so as to minimize the footprint of the stack.

For the interconnect process, the stack may be supported, for example, at the back side of the lowest of the die in the stack, and the interconnect material may be applied along a trajectory over the pads to be connected and the die surfaces between them. The interconnect material may be applied using an application tool such as, for example, a syringe or a nozzle. The material exits the tool in a deposition direction generally toward the interconnect terminals, and the tool is moved over the die stack face in a work direction.

Die stacks having resulting traces of interconnect material are shown by way of illustration at 62 in FIGS. 6A, 6B. This procedure is repeated to deposit traces connecting all the pads for which electrical interconnection is desired, and following deposition the material is cured.

Figure 7A:
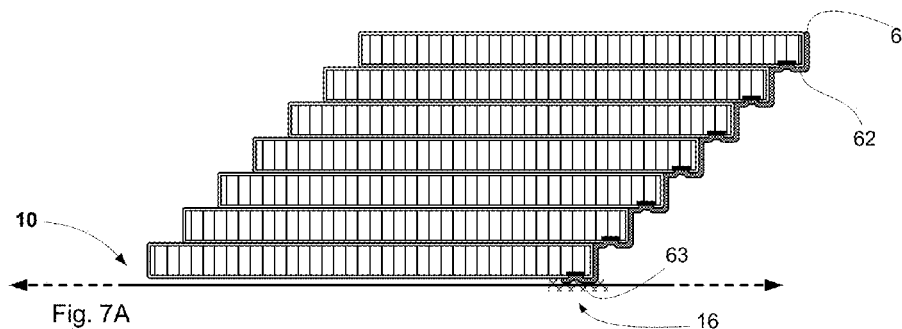
FIGS. 7A-7C are diagrammatic sketches in sectional views illustrating die stacks constructed generally as in FIGS. 6A, 6B mounted on a support according to examples of the invention.
Figure 7B:
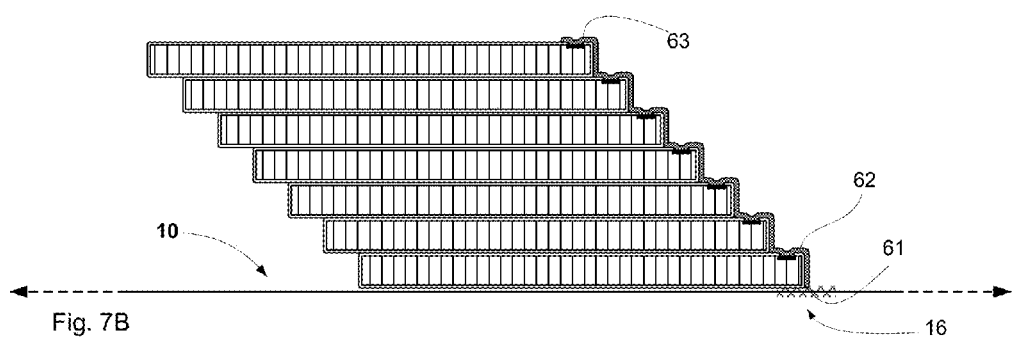
Figure 7C:
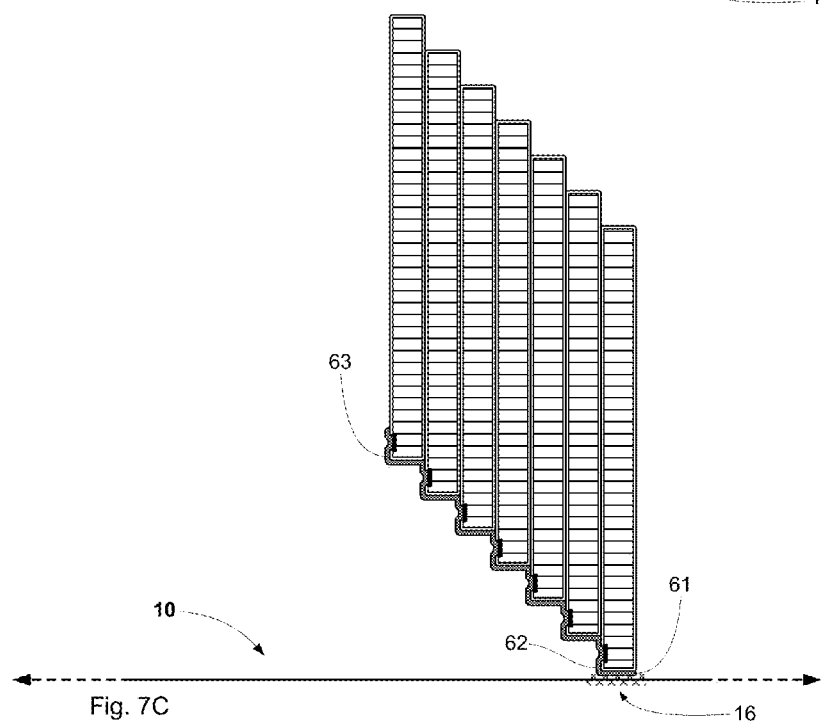

Assemblies of electrically interconnected stacked die can optionally be tested prior to further processing. Complete assemblies can be mounted on a support, and interconnected die in the stack can be connected with underlying circuitry by way of secured electrical contact with the interconnections. For example, a printed circuit board or package substrate can be provided, having bond pads arranged at a die attach side to correspond with the ends 61 or 63 of the die stack interconnects. Referring to FIG. 6B, for example, the interconnect 62 has an end 63 at the margin of the active side of a die at the top (or, if the assembly is inverted, at the bottom) of the assembly, and an end 61 at a back side edge of a die at the bottom (or, if the assembly is inverted, at the top) of the assembly. A support such as a circuit board, for example, can be provided having z-interconnect sites arranged in a manner corresponding to the arrangement of interconnect ends 61 or 63. The assembly can be mounted on the support for example with the active sides of the die facing toward the support, and with the interconnect ends 63 aligned with and contacting the z-interconnect sites (see, for example, FIG. 7A); or for example with the back sides of the die facing toward the support and with the interconnect ends 61 aligned with and contacting the z-interconnect sites (see, for example, FIG. 7B). Alternatively, for example, the assembly can be mounted with the die oriented perpendicularly (or at any other angle) to the support (see, for example, FIG. 7C), with the interconnect ends 61 aligned with and contacting the z-interconnect sites.

The die in the stacked die assembly may be all of the same size, as shown for example in the FIGS. 6A, 6B, but die of different sizes may according to the invention be stacked and interconnected by conductive polymer traces. In some embodiments for example, a smaller die may be stacked on a larger die, with the smaller die situated so that peripheral die pads in the margin near at least one die edge of the larger die are available for interconnection. In such an arrangement the stack of die may appear in section as a stepped pyramid; or, the die may be displaced in one direction with respect to a first die edge, but vertically interconnected on another die edge. An upper die may be larger in one dimension (that is, the die may be same width but one longer than the other), or in both directions (that is, one die both wider and longer than the other) than a lower die. For example, a 10×10 mm die may be stacked over a 10×12 mm die having peripheral pads at the shorter edges. In such an embodiment the smaller die is situated over the larger die such that the die pads at the narrow ends of the larger die are exposed adjacent two edges of the smaller die. Or, for example, a 10×10 mm die may be stacked over a 12×12 mm die, and situated such that peripheral pads along any one or more (or all four) edges of the larger die are available for interconnection.

Stacked die assemblies according to the invention may have as many die as may be desired, and there may as a matter of mechanical design be no upper limit. The illustrated examples show three or four or seven die in each stack, but assemblies having two or more die in the stack are contemplated. Particularly, for example, assemblies having four, or six, or eight, or 16 or 17 die may be made and mounted without solder and without an interposed substrate or leadframe directly onto a support.

Additionally, or alternatively, larger stacked die assemblies may be made by constructing stacked die units in a modular design, and then stacking modular units.

The stackable modular units can be robust and testable. For example, particular two-die units and four die units may constitute modules; from these modules a six-die assembly may be made by stacking a two-die unit and a four-die unit, or an eight-die assembly may be made by stacking two four-die units, for example.

As illustrated above, stacked die units or assemblies constructed according to the invention can be mounted on and electrically interconnected with circuitry directly on a support. For example, a stacked die unit can be mounted upon a circuit side of package substrate, and electrically interconnected by connection of all or selected ones of the interconnect ends of the unit with bond pads on the substrate. The substrate may be any of a variety of package substrates, including for example laminated or buildup substrates having one or more patterned metal films and one or more dielectric layers, such a BT substrates or ceramic substrates for example; and flex substrates, for example. Or, for example, a stacked die unit can be mounted upon the active side of another die, and electrically interconnected by connection of all or selected ones of the interconnect ends of the unit with pads on the die. Or, for example, a die stack assembly can be mounted on a leadframe, and electrically interconnected by connection of all or selected ones of the interconnect ends of the unit with sites on the leads. Or, for example, a die stack assembly can be mounted on a printed circuit board (such as a motherboard, for example), and electrically interconnected by connection of all or selected ones of the interconnect ends of the unit with sites on the printed circuit.

In other embodiments the stacked die units or assemblies may be electrically connected to a first support by connection of all or selected ones of the interconnect ends of the unit with sites on the support, and mounted on an additional support. The additional support may itself be electrically connected to the first support. In such embodiments at least some of the electrical connections of the die in the stacked die units or assemblies are not electrically connected to the additional support and, in some such embodiments there is no direct electrical connection between the die unit or assembly and interconnect pads or sites on the additional support.

The additional support may have no electrical or electronic components, so that it serves simply as a mechanical or structural support for the die assembly or unit. It may include, for example, a dummy die; or a sheet of dielectric material; or a heat dissipating sheet or block of a material having a high heat capacity or high thermal conductivity.

Alternatively, the additional support may include only passive electrical features. The passive electrical features in the additional support may be electrically connected to one or more sites in the first support; or they may be connected to a selected number (less than all) of the interconnections in the die unit or assembly; or they may be connected to a selected number (less than all) of the interconnections in the die unit or assembly as well as to one or more sites in the support. It may include, for example, a ground plane.

The additional support may include electrical circuitry. It may include, for example, a printed circuit board; or a package substrate; or a leadframe.

The additional support may include electronic circuitry, and may include one or more semiconductor devices. For example, the additional support may be a semiconductor package; or an additional die. In some such examples one or more connection sites in the additional support may be electrically connected to sites in the first support; or to a selected number (less than all) of the interconnections in the die unit or assembly; or to a selected number (less than all) of the interconnections in the die unit or assembly as well as to one or more sites in the support.

In particular embodiments where the additional support includes electronic circuitry, the electronic circuitry in the second support and the die assembly or unit are separately connected to the first support. That is, the electrical connections between the die assembly or unit and the first support bypass the second support, and the respective connections may be made to separate sets of sites on the first support. In some such embodiments the additional support is a die; pads on the die are connected to a second set of bond sites on the first support, and interconnects in the die assembly or unit are connected to a first set of bond sites on the first support. In other such embodiments the additional support is a semiconductor package, and lands on the package are connected to a second set of bond pads on the first support, and interconnects in the die assembly or unit are connected to a first set of bond sites on the first support.

Figure 8:
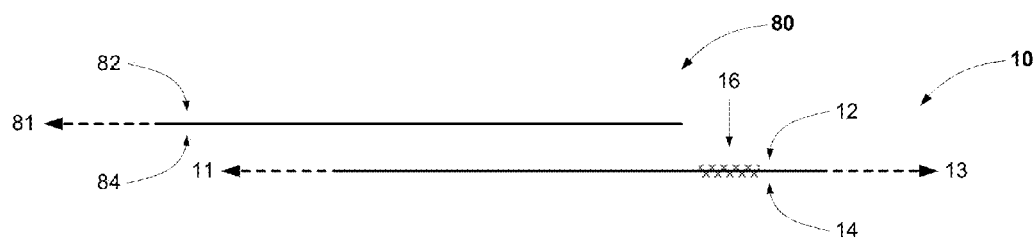
FIGS. 8 and 9 are diagrammatic representations each illustrating generalized first and second supports to which a die assembly can be mounted and electrically connected according to other embodiments of the invention.
Figure 9:
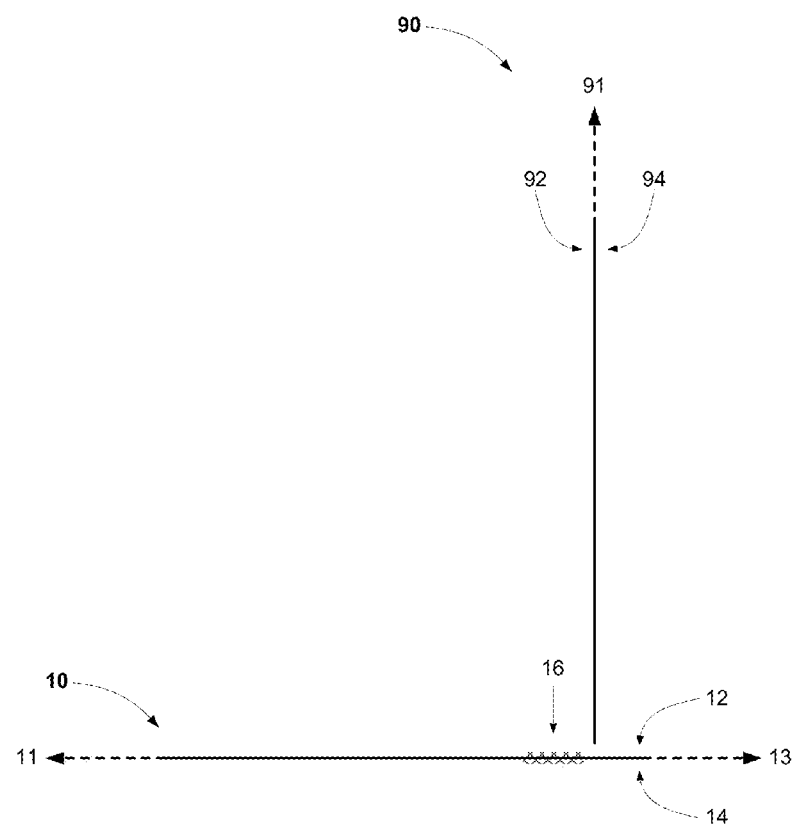

FIG. 8 illustrates symbolically in a sectional view a generalized second support 80, having a die mount side 82 and a reverse side 84, arranged generally parallel to a generalized first support 10 configured as described in FIG. 1. FIG. 9 illustrates symbolically in a sectional view a generalized second support 90, having a die mount side 92 and a reverse side 94, arranged generally perpendicular to a generalized first support 10 configured as described in FIG. 1. A die assembly or unit can be mounted on the die mount side 82 or 92 of the second support 80 or 90, and the die assembly can be electrically connected to the Interconnect sites 16 at the connection side of the first support, generally as described above.

The thickness of the second support is not indicated in the FIG., as the support may range from very thick to very thin, depending among other things upon the character of the second support. For instance, a printed circuit board may have a greater thickness than a laminated substrate having two metal layers separated by a single dielectric layer, or than a flex substrate;

and, for instance, a package may have greater thickness than a die. The first and second supports may have greater or lesser length and width dimensions, as suggested in FIGS. 8 and 9 by dashed arrows 11 and 13 and arrow 81.

Figure 10A:
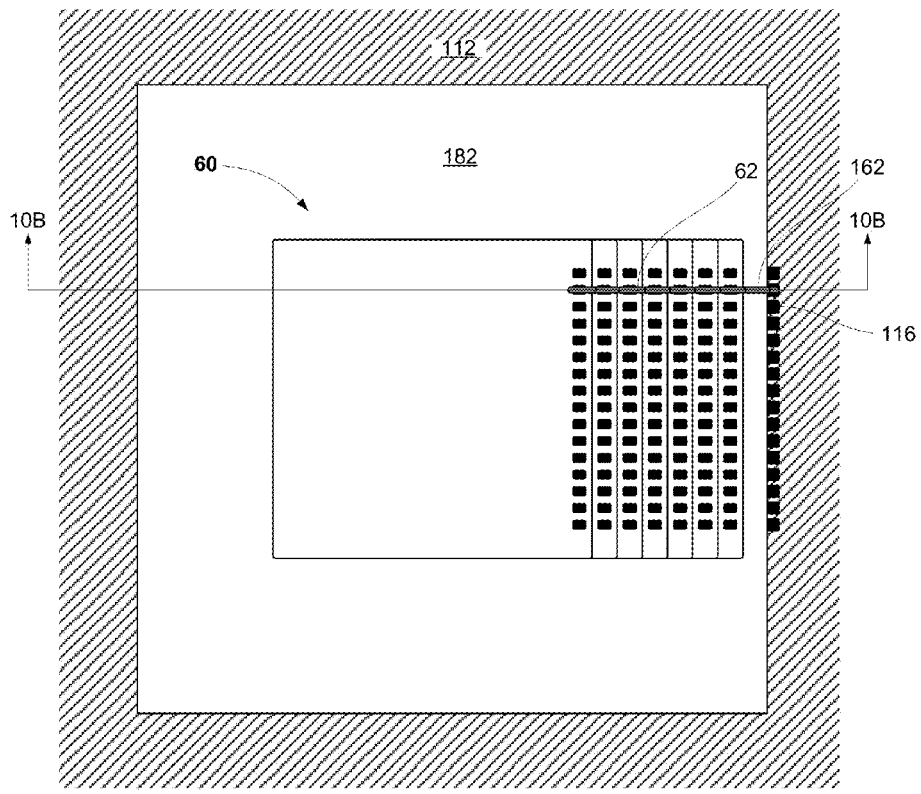
FIGS. 10A, 10B are diagrammatic sketches in plan and sectional views illustrating a die assembly in an offset configuration, mounted onto a die (serving as a second substrate) and electrically connected to a first substrate according to an embodiment of the invention.
Figure 10B:
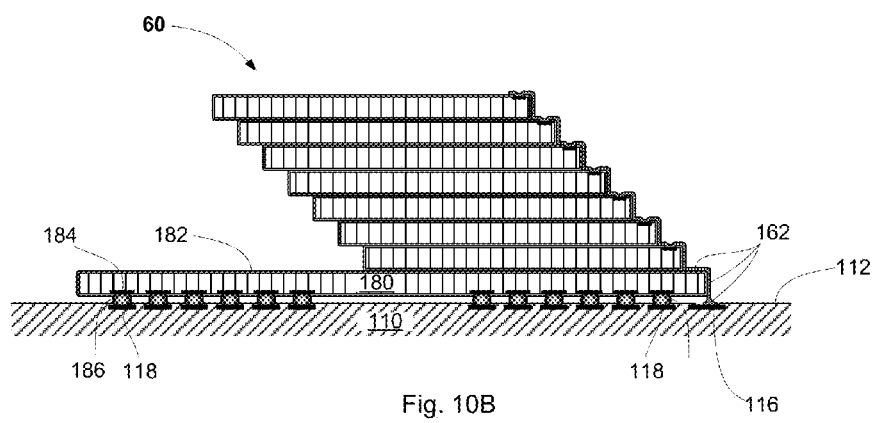

FIGS. 10A and 10B illustrate an example of an embodiment in which the additional support is a die, mounted onto and electrically connected to the first support by flip chip interconnect; and in which the die assembly is an offset stack of die that is connected to the first support and is not electrically connected to the flip-chip die. Referring to the FIGs., the first support 110 has a circuit surface 112 at which a row of first bond sites 116 and an array of second bond sites 118 exposed for electrical connection. In this example, the additional support 180 is a die (a "supporting die") having an array of pads 184 at one surface, and having solder bumps 186 attached to the die pads 184. The array of die pads 184 and the array of second bond sites 118 are arranged so that the bumps align with corresponding second bond sites when the supporting die is positioned in a die-down orientation over the first support. The row of first bond sites 116 is arranged so that when the supporting die 180 is so aligned, an edge of the supporting die 180 is parallel to and adjacent to the row of first bond sites 116 or (as in the example shown in the FIGs.) partly overlying the row of first bond sites 116. The bumps 186 are mated to and electrically connected to the pads 118 by reflow of the solder bumps. The backside 182 of the die 180 faces away from the first support, and provides a mounting surface for the die assembly 60, which is configured in this example generally as described with reference to FIGS. 6A, 6B. The interconnect edge of the die assembly is situated near (and in this example is set back slightly from) the edge of the die 180 that is oriented parallel the row of bond sites 116. The die-to-die electrical interconnects are extended as illustrated at 162, to connect the electrical interconnects 62 to corresponding respective first bonds sites 116.

Referring to FIGS. 10A, 10B, various additional embodiments are contemplated. For example, where the additional support is a die, and is mounted die-down, as in the FIGs., the die may be electrically connected to the first support by tab interconnects. And, for example, the second support may be a leadframe package, oriented with exposed package leads or lands facing the first support, and the package may be mounted in a conventional surface mount fashion; or, for example, the second support may be a LGA or BGA package, oriented with the land side facing the first support, and the package may be mounted and electrically connected in a conventional solder ball grid or surface mount fashion.

And, for example, where the additional support is a die, the supporting die may have any of a variety of functionalities. For example, the die assembly may be a stack of memory die and the supporting die may include processor functionality, such as an analog or digital signal processing, for example. The supporting die may be a base band controller IC, for example, and the die assembly may include a stack of memory die. And, for example, where the additional support is a package, the die assembly may be a stack of memory die and the additional package may include one or more die having any of a variety of functionalities, including one or more signal processing functionalities, for example.

Or, for example, the additional support may be a die mounted die-up, that is, with the active side facing away from the first support, and electrically connected to the first support by wire bonds connecting rows or arrays of die pads along one or more die margins to corresponding bond sites on the first support. Preferably, one or more edges of the supporting die has no die pads, and the supporting die is situated such the pad-free edge of the supporting die is parallel to and adjacent to (or partly overlying) a row of first bond sites in the first support. The die unit or assembly is then mounted over the upward-facing surface of the supporting die and situated such that the interconnect edge of the die assembly is situated near (and may be set back slightly from) the pad-free edge of the supporting die. The die-to-die electrical interconnects are extended to connect the electrical interconnects to corresponding first bonds sites in the first support, generally as described above. And, for example, the second support may be a leadframe package or LGA package, oriented with exposed package leads or lands facing away from the first support, and the package may be mounted is a suitable position on the first substrate and electrically connected to the first support by, for example wire bonds connecting leads or lands on the supporting package to bond sites in the first support.

Other embodiments are within the scope of the invention.

We claim:

1. A device comprising
 a support having electrical connection sites at a surface thereof, and
 a stacked die assembly mounted onto the surface and electrically connected to one or more of the connection sites,
 wherein each die in the stacked die assembly has peripheral interconnect terminals
 each interconnect terminal electrically coupled with a die pad of a die of the stacked die assembly at an active side of the die and
 each interconnect terminal is disposed at or overlying the active side of the die to which the interconnect terminal is coupled,
 wherein a plurality of die in the stack are electrically interconnected by a same line or a same trace of an electrically conductive polymer or an electrically conductive ink, and
 wherein the line or the trace of the electrically conductive polymer or the electrically conductive ink contacts the peripheral interconnect terminals on each of the respective electrically interconnected plurality of die,
 wherein the active side of at least a first die in the stack faces in a first direction, and the active side of at least a second die faces in a second direction, opposite the first direction.

2. The device of claim 1 wherein the stacked die assembly comprises a stack of at least two nonpackaged die mounted one over another.

3. The device of claim 1 wherein the peripheral interconnect terminals on at least a first die in the stack comprise off-die terminals.

4. A device comprising
 a first support having electrical connection sites at a surface thereof,
 a second support mounted on the first support, and a stacked die assembly mounted onto a surface of the second support and electrically connected to one or more of the connection sites on the first support,
 wherein each die in the stacked die assembly has peripheral interconnect terminals, each interconnect terminal electrically coupled with a die pad of a die of the stacked die assembly at an active side of the die and
 each interconnect terminal is disposed at or overlying the active side of the die to which the interconnect terminal is coupled,
 wherein a plurality of die in the stack are electrically interconnected by a line or a trace of an electrically conductive polymer or an electrically conductive ink, and
 wherein the line or the trace of the electrically conductive polymer or the electrically conductive ink contacts the peripheral interconnect terminals on each of the respective electrically interconnected plurality of die.

5. The device of claim 4 wherein the plurality of die in the stack are oriented such that the active sides of the respective plurality of die all face in a first direction.

6. The device of claim 4 wherein the active side of at least a first die in the stack faces in a first direction, and the active side of at least a second die faces in a second direction, opposite the first direction.

7. The device of claim 4 wherein the stacked die assembly is interconnected such that the active sides of the respective plurality of die face toward said surface of said first support.

8. The device of claim 4 wherein the stacked die assembly is interconnected such that the back sides of the respective plurality of die face toward said surface of said first support.

9. The device of claim 4 wherein one or more of the plurality of die in the stack are oriented such that the respective active sides face away from said surface of said first support and one or more additional die in the stack are oriented such that the respective active sides face toward said surface of said first support.

10. The device of claim 4, wherein front and back sides of each die in the stacked die assembly define a plane, and wherein the stack of the plurality of die is oriented so that the plane of each of the plurality of die is nonparallel with said surface of said first support.

11. A method for making a device, comprising:
 providing a stacked die assembly wherein each die in the stacked die assembly has peripheral interconnect terminals, each interconnect terminal electrically coupled with a die pad of a die of the stacked die assembly at an active side of the die and each interconnect terminal is disposed at or overlying the active side of the die to which the interconnect terminal is coupled,
 wherein a plurality of die in the stack are electrically interconnected by a same line or a same trace of an electrically conductive polymer or and electrically conductive ink, and
 wherein the line of the trace of the electrically conductive polymer of the electrically conductive ink contacts the peripheral interconnect terminals on each of the respective interconnected plurality of die;
 providing a first support having electrical connection sites at a surface thereof;
 providing a second support having a mount surface; and
 mounting the die assembly on the mount surface of the second support and electrically connecting one or more of the peripheral interconnect terminals in the die assembly to one or more of the connection sites on the first support.

12. The method of claim 11, wherein the plurality of die in the stack are oriented such that the active sides of the respective plurality of die all face in a first direction.

13. The method of claim 11, wherein the active side of at least a first die in the stack faces in a first direction, and the active side of at least a second die faces in a second direction opposite the first direction.

14. The method of claim 11, wherein the stacked die assembly is interconnected such that the active sides of the respective plurality of die face toward said surface of said first support.

15. The method of claim 11, wherein the stacked die assembly is interconnected such that the back sides of the respective plurality of die face toward said surface of said first support.

16. The method of claim 11, wherein one or more of the plurality of die in the stack are oriented such that the respective active sides face away from said surface of said first support and one or more additional die in the stack are oriented such that the respective active sides face toward said surface of said first support.

17. The method of claim 11, wherein front and back sides of each die in the stacked die assembly define a plane, and wherein the stack of the plurality of die is oriented so that the plane of each of the plurality of die is nonparallel with said surface of said first support.

* * * * *